(12) United States Patent
Jung et al.

(10) Patent No.: US 12,477,941 B2
(45) Date of Patent: Nov. 18, 2025

(54) METHOD OF MANUFACTURING DISPLAY APPARATUS

(71) Applicant: SAMSUNG DISPLAY CO., LTD., Yongin-si (KR)

(72) Inventors: Sukwon Jung, Yongin-si (KR); Sangwon Lee, Yongin-si (KR); Kyuho Jung, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 352 days.

(21) Appl. No.: 18/119,734

(22) Filed: Mar. 9, 2023

(65) Prior Publication Data
US 2023/0292581 A1 Sep. 14, 2023

(30) Foreign Application Priority Data
Mar. 10, 2022 (KR) .................. 10-2022-0030317

(51) Int. Cl.
| | | |
|---|---|---|
| H10K 71/50 | (2023.01) | |
| H10K 59/12 | (2023.01) | |
| H10K 59/80 | (2023.01) | |
| H10K 102/00 | (2023.01) | |

(52) U.S. Cl.
CPC ......... *H10K 71/50* (2023.02); *H10K 59/1201* (2023.02); *H10K 59/872* (2023.02); *H10K 2102/311* (2023.02)

(58) Field of Classification Search
CPC .. H10K 71/50; H10K 59/1201; H10K 59/872; H10K 2102/311; H10K 50/84; H10K 71/00; G06F 1/1626; G06F 1/1637; G06F 1/1652; H04M 1/0269; G09F 9/301; H05K 5/0217; H05K 5/03
See application file for complete search history.

(56) References Cited

U.S. PATENT DOCUMENTS

| | | |
|---|---|---|
| 10,758,968 B2 | 9/2020 | Mase et al. |
| 11,751,416 B2 | 9/2023 | Mun et al. |
| 11,793,025 B2 | 10/2023 | Lee et al. |
| 11,999,147 B2 | 6/2024 | Hwang et al. |
| 2020/0290337 A1 | 9/2020 | Jung et al. |
| 2021/0070029 A1* | 3/2021 | Hajipetrou ............ G06F 3/0446 |
| 2021/0280096 A1 | 9/2021 | Ahn et al. |
| 2022/0118731 A1 | 4/2022 | Shin et al. |

FOREIGN PATENT DOCUMENTS

| | | |
|---|---|---|
| CN | 112309255 A | 2/2021 |
| CN | 114156317 A | 3/2022 |
| KR | 1020180021073 A | 2/2018 |
| KR | 1020200058638 A | 5/2020 |
| KR | 1020200110488 A | 9/2020 |
| KR | 1020200138461 A | 12/2020 |
| KR | 1020220011832 A | 2/2022 |
| KR | 1020220050299 A | 4/2022 |

* cited by examiner

*Primary Examiner* — J.E. Schoenholtz
(74) *Attorney, Agent, or Firm* — CANTOR COLBURN LLP

(57) ABSTRACT

A method of manufacturing a display apparatus which displays high-quality images includes disposing a case on a lamination mold, disposing a display panel such that a first surface of the display panel faces a first surface of the case, and attaching the display panel on the case with a first adhesive layer between the first surface of the case and the first surface of the display panel, and pressing the display panel by a cap including an indented portion in a surface of the cap.

27 Claims, 20 Drawing Sheets

ULTRAVIOLET RAY IRRADIATION

METHOD OF MANUFACTURING DISPLAY APPARATUS

This application is based on and claims priority under 35 U.S.C. § 119 to Korean Patent Application No. 10-2022-0030317, filed on Mar. 10, 2022, and all the benefits accruing therefrom under 35 U.S.C. § 119, the content of which in its entirety is herein incorporated by reference.

BACKGROUND

1. Field

Embodiments relate to a method of manufacturing a display apparatus, and more particularly, to a method of manufacturing a display apparatus that may display high-quality images.

2. Description of the Related Art

A display apparatus may be an electronic apparatus or a part of an electronic apparatus such as a mobile phone or tablet personal computer, and may provide visual information such as images to users. A display apparatus with a structure in which a portion of a display unit is bent is being developed to display images even on a lateral surface or corner thereof. To bend the display unit, a guide film and the like are used during a process of manufacturing a display apparatus.

SUMMARY

However, in a method of manufacturing a display apparatus according to the related art, a display unit is bent in a direction other than a preset direction at a corner of the display apparatus.

Embodiments include a method of manufacturing a display apparatus that may display high-quality images at the corner of the display apparatus. A display unit is bent in a preset direction at a corner of the display apparatus. However, such a technical problem is an example, and the disclosure is not limited thereto.

Additional features will be set forth in part in the description which follows and, in part, will be apparent from the description, or may be learned by practice of the presented embodiments of the disclosure.

In an embodiment of the disclosure, a method of manufacturing a display apparatus includes disposing a case on a lamination mold, disposing a display panel such that a first surface of the display panel faces a first surface of the case, and attaching the display panel on the case with a first adhesive layer between the first surface of the case and the first surface of the display panel, and pressing the display panel by a cap having an indented portion in a surface of the cap facing the display panel.

In an embodiment, the display panel may include a central area and a corner area in a corner of the display panel, and the attaching the display panel may include disposing the display panel such that the corner area corresponds to a corner of the case.

In an embodiment, the first surface of the case may have a shape corresponding to the indented portion of the cap.

In an embodiment, the first surface of the case may have a shape engaged with the indented portion of the cap.

In an embodiment, the case may include a material having elasticity.

In an embodiment, the case may include at least one of silicone, polycarbonate, and polyurethane.

In an embodiment, the pressing the display panel may include disposing the cap such that a second surface of the display panel opposite to the first surface of the display panel faces the cap.

In an embodiment, the surface of the cap may be non-adhesive processed.

In an embodiment, the surface of the cap may be coated with fluorine-based compound.

In an embodiment, the attaching the display panel may include attaching a second adhesive layer to a second surface of the display panel opposite to the first surface of the display panel.

In an embodiment, the second adhesive layer may include at least one of a pressure sensitive adhesion ("PSA"), an optical clear adhesive ("OCA"), and an optical clear resin ("OCR").

In an embodiment, the method of manufacturing the display apparatus may further include removing the cap from the display panel, disposing a cover window to face the second surface of the display panel, and coupling the display panel to the cover window through the second adhesive layer.

In an embodiment, the method of manufacturing the display apparatus may further include detaching the display panel from the case.

In an embodiment, the case may include an ultraviolet-transmissive material.

In an embodiment, the detaching the display panel may include detaching the display panel from the case by irradiating an ultraviolet ray to the display panel in a direction of a second surface of the case opposite to the first surface of the case, and lowering adhesiveness of the first adhesive layer.

In an embodiment of the disclosure, a method of manufacturing a display apparatus includes disposing a case on a lamination mold, the case including a light-blocking layer, disposing a display panel such that a first surface of the display panel faces a surface of the case, and attaching the display panel on the case with a first adhesive layer between the surface of the case and the first surface of the display panel, and pressing the display panel by a cap including an indented portion in a lower surface of the cap facing the display panel.

In an embodiment, the display panel may include a central area and a corner area in a corner of the display panel, and the attaching the display panel may include disposing the display panel such that the corner area corresponds to a corner of the case.

In an embodiment, the surface of the case may have a shape corresponding to the indented portion of the cap.

In an embodiment, the surface of the case may have a shape engaged with the indented portion of the cap.

In an embodiment, the case may include a material having elasticity.

In an embodiment, the case may include at least one of silicone, polycarbonate, and polyurethane.

In an embodiment, the pressing the display panel may include disposing the cap such that a second surface of the display panel opposite to the first surface of the display panel faces the cap.

In an embodiment, the surface of the cap may be non-adhesive processed.

In an embodiment, the surface of the cap may be coated with a fluorine-based compound.

In an embodiment, the attaching the display panel may include attaching a second adhesive layer to an upper surface of the display panel.

In an embodiment, the second adhesive layer may include at least one of a pressure sensitive adhesion ("PSA"), an optical clear adhesive ("OCA"), and an optical clear resin ("OCR").

In an embodiment, the method of manufacturing the display apparatus may further include removing the cap from the display panel, disposing a cover window to face an upper surface of the display panel, and coupling the display panel to the cover window through the second adhesive layer.

These and/or other features will become apparent and more readily appreciated from the following description of the embodiments, the accompanying drawings, and claims.

BRIEF DESCRIPTION OF THE DRAWINGS

The above and other features and advantages of illustrative embodiments of the disclosure will be more apparent from the following description taken in conjunction with the accompanying drawings, in which.

DETAILED DESCRIPTION

Figure 1:
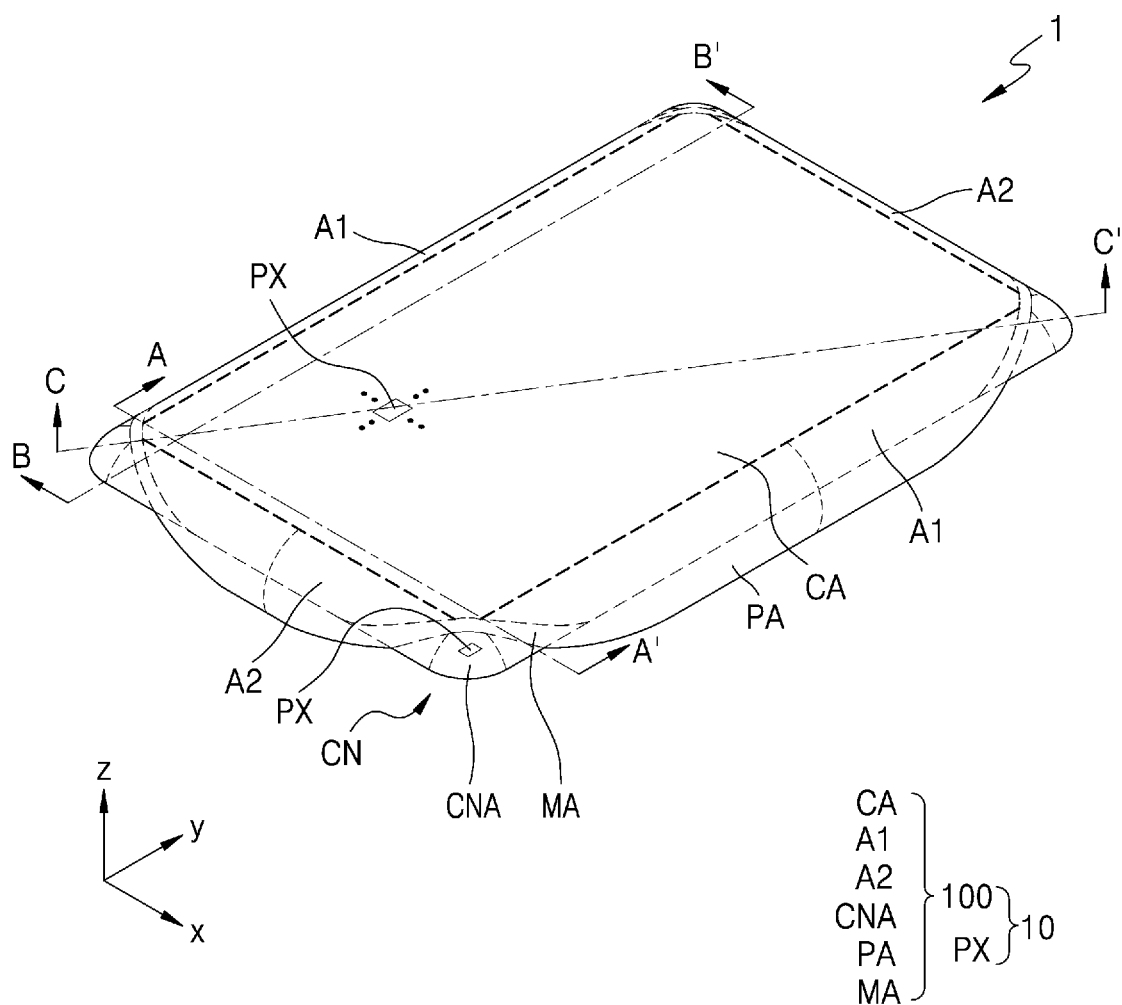
FIG. 1 is a schematic perspective view of an embodiment of a display apparatus.

Reference will now be made in detail to embodiments, illustrative embodiments of which are illustrated in the accompanying drawings, where like reference numerals refer to like elements throughout. In this regard, the embodiments may have different forms and should not be construed as being limited to the descriptions set forth herein. Accordingly, the embodiments are merely described below, by referring to the drawing figures, to explain features of the description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the disclosure allows for various changes and numerous embodiments, illustrative embodiments will be illustrated in the drawings and described in the written description. Effects and features of the disclosure, and methods for achieving them will be clarified with reference to embodiments described below in detail with reference to the drawings. However, the disclosure is not limited to the following embodiments and may be embodied in various forms.

Hereinafter, embodiments will be described with reference to the accompanying drawings, where like reference numerals refer to like elements throughout and a repeated description thereof is omitted.

As used herein, when various elements such as a layer, a region, a plate, or the like are disposed "on" another element, not only the elements may be disposed "directly on" the other element, but another element may be disposed therebetween. In addition, sizes of elements in the drawings may be exaggerated or reduced for convenience of explanation. The size and thickness of each element shown in the drawings are arbitrarily represented for convenience of description, for example, and thus, the disclosure is not necessarily limited thereto.

The x-axis, the y-axis and the z-axis are not limited to three axes of the quadrangular (e.g., rectangular) coordinate system, and may be interpreted in a broader sense. The x-axis, the y-axis, and the z-axis may be perpendicular to one another, or may represent different directions that are not perpendicular to one another, for example.

While such terms as "first" and "second" may be used to describe various components, such components must not be limited to the above terms. The above terms are used to distinguish one component from another.

The singular forms "a," "an," and "the" as used herein are intended to include the plural forms as well unless the context clearly indicates otherwise.

It will be understood that the terms "comprise," "comprising," "include" and/or "including" as used herein specify the presence of stated features or components but do not preclude the addition of one or more other features or components.

In the specification, "A and/or B" means A or B, or A and B. In the specification, "at least one of A and B" means A or B, or A and B.

Figure 2A:
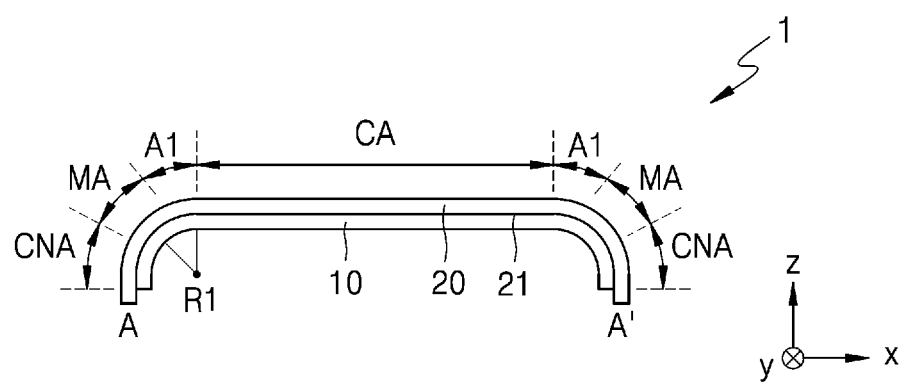
FIG. 2A is a schematic cross-sectional view of the display apparatus, taken along line A-A' of FIG. 1.
Figure 2B:
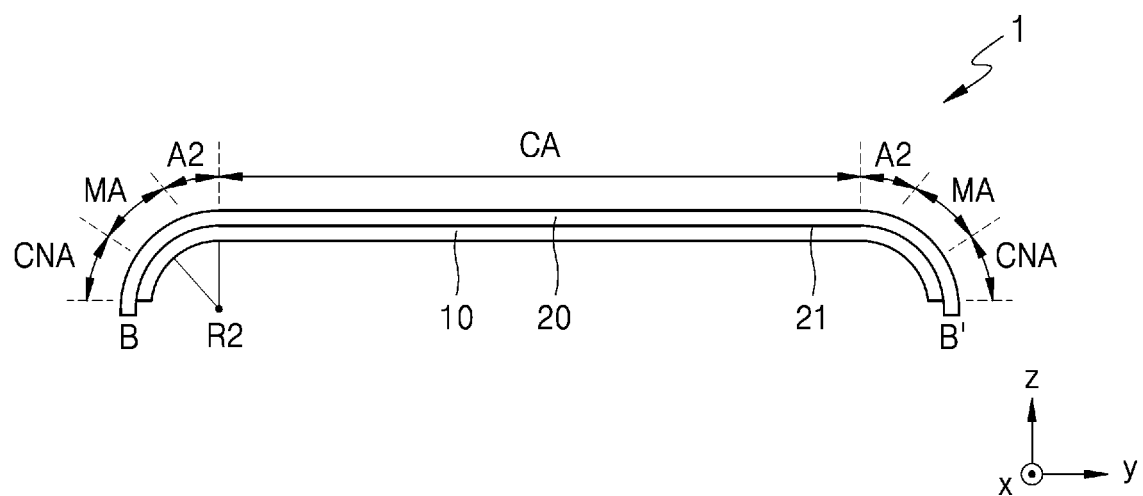
FIG. 2B is a schematic cross-sectional view of the display apparatus, taken along line B-B' of FIG. 1.
Figure 2C:
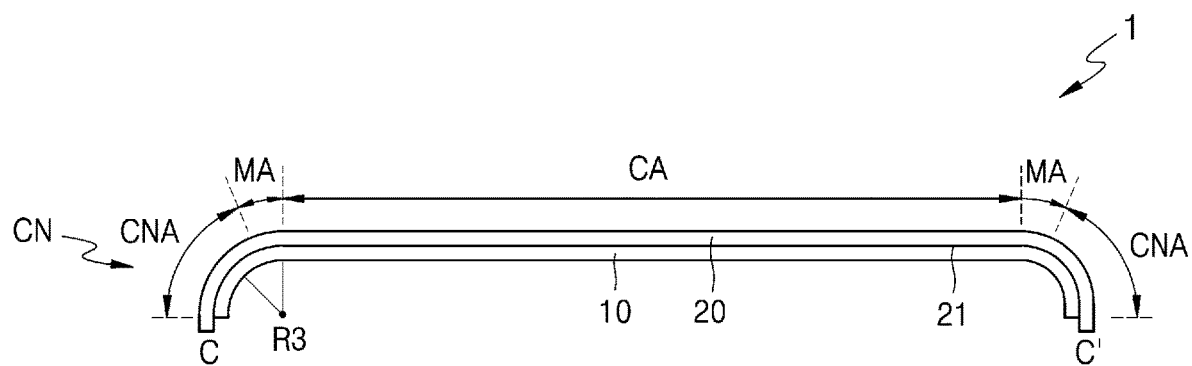
FIG. 2C is a schematic cross-sectional view of the display apparatus, taken along line C-C' of FIG. 1.

FIG. 1 is a schematic perspective view of an embodiment of a display apparatus 1, FIG. 2A is a schematic cross-sectional view of the display apparatus 1, taken along line A-A' of FIG. 1, FIG. 2B is a schematic cross-sectional view of the display apparatus 1, taken along line B-B' of FIG. 1, and FIG. 2C is a schematic cross-sectional view of the display apparatus 1, taken along line C-C' of FIG. 1.

The display apparatus 1 is an apparatus for displaying moving images or still images and may include portable electronic apparatuses such as mobile phones, smart phones, tablet personal computers, mobile communication terminals, electronic organizers, electronic books, portable multimedia players ("PMP"), navigations, and ultra-mobile personal computers ("UMPC"), or the like. The display apparatus 1 may be an electronic apparatus including televisions, notebook computers, monitors, advertisement boards, Internet of things ("IoT"), or the like. In an alternative embodiment, the display apparatus 1 may be wearable devices including smartwatches, watchphones, glasses-type displays, or head-mounted displays ("HMD"). In an alternative embodiment, the display apparatus 1 may be a portion of a different apparatus. In an embodiment, the display apparatus 1 may be a display unit of an arbitrary electronic apparatus. In an alternative embodiment, the display apparatus 1 may be instrument panels for automobiles, center fascias for automobiles, or center information displays ("CID") arranged on a dashboard, room mirror displays that replace side mirrors of automobiles, and displays arranged on the backside of front seats as an entertainment for back seats of automobiles.

Referring to FIGS. 1 and 2A to 2C, the display apparatus 1 that may display images, may include an edge extending in a first direction and an edge extending in a second direction. Here, the first direction and the second direction may be directions crossing each other. In an embodiment, an angle defined by the first direction and the second direction may be an acute angle. In an alternative embodiment, an angle defined by the first direction and the second direction may be a dull angle or a right angle. Hereinafter, for convenience of description, the case where the first direction and the second direction are perpendicular to each other is mainly described. In an embodiment, the first direction may be an x direction or a −x direction, and the second direction may be a y direction or a −y direction.

A corner CN at which an edge extending in the first direction (e.g., the x direction or the −x direction) meets an edge extending in the second direction (e.g., the y direction or the −y direction), may have a preset curvature.

The display apparatus 1 may include a cover window 20 and a display panel 10. The cover window 20 may protect the display panel 10. In an embodiment, the cover window 20 may be disposed on the display panel 10. In an embodiment, the cover window 20 may be a flexible window. The cover window 20 may be easily bent by external force to form an indented portion 21. Because the indented portion 21 of the cover window 20 surrounds the display panel 10, the indented portion 21 may protect the display panel 10 from external impacts.

The cover window 20 may include glass, sapphire, or plastic. The cover window 20 may include ultra-thin glass. In an alternative embodiment, the cover window 20 may include colorless polyimide.

The display panel 10 may be disposed under the cover window 20. The display panel 10 may be attached to the cover window 20 by an optically clear adhesive ("OCA") (not shown), for example.

The display panel 10 may display images. The display panel 10 may include a substrate 100 and pixels PX. The display panel 10 may include a central area CA, a first area A1, a second area A2, a corner area CNA, an intermediate area MA, and a peripheral area PA. In an embodiment, the substrate 100 of the display panel 10 may include the central area CA, the first area A1, the second area A2, the corner area CNA, the intermediate area MA, and the peripheral area PA. That is, the central area CA, the first area A1, the second area A2, the corner area CNA, the intermediate area MA, and the peripheral area PA may be defined in the substrate 100.

The central area CA may be a flat region. The display apparatus 1 may display most of an image in the central area CA.

The first area A1 may be adjacent to the central area CA in the first direction (e.g., the x direction or the −x direction). The first area A1 may extend in the second direction (e.g., the y direction or the −y direction). The display panel 10 may be bent in the first area A1. That is, unlike the central area CA, the first area A1 may be defined as a bent area in a cross-section (e.g., a zx cross-section) in the first direction. In contrast, the first area A1 may not be bent in a cross-section (e.g., an yz cross-section) in the second direction. That is, the first area A1 may be a region bent around an axis extending in the second direction.

Though it is shown in FIG. 2A that the first area A1 disposed in the x direction from the central area CA, and the first area A1 disposed in the −x direction from the central area CA have the same curvature, the invention is not limited thereto. In an embodiment, the first area A1 disposed in the x direction from the central area CA, and the first area A1 disposed in the −x direction from the central area CA may have different curvatures.

The second area A2 may be adjacent to the central area CA in the second direction. The second area A2 may extend in the first direction. The display panel 10 may be bent in the second area A2. That is, unlike the central area CA, the second area A2 may be defined as a bent area in a cross-section (e.g., the yz cross-section) in the second direction. In contrast, the second area A2 may not be bent in a cross-section (e.g., the zx cross-section) in the first direction. That is, the second area A2 may be a region bent around an axis extending in the first direction.

Though it is shown in FIG. 2B that the second area A2 disposed in the y direction from the central area CA, and the second area A2 disposed in the −y direction from the central area CA have the same curvature, the invention is not limited thereto. In an embodiment, the second area A2 disposed in the y direction from the central area CA, and the second area A2 disposed in the −y direction from the central area CA may have different curvatures.

The display panel 10 may be bent in the corner area CNA. The corner area CNA may be a region arranged in the corner CN. That is, the corner area CNA may be a region where an edge of the display apparatus 1 in the first direction meets an edge of the display apparatus 1 in the second direction. The corner area CNA may surround at least a portion of the central area CA, the first area A1, and the second area A2. In an alternative embodiment, the corner area CNA may surround at least a portion of the central area CA, the first area A1, the second area A2, and the intermediate area MA.

As described above, in the case where the first area A1 extends in the second direction and bends in a cross-section (e.g., the zx cross-section) in the first direction, and the second area A2 extends in the first direction and bends in a cross-section (e.g., the yz cross-section) in the second direction, at least a portion of the corner area CNA may bend in both the cross-section (e.g., the zx cross-section) in the first direction and the cross-section (e.g., the yz cross-section) in the second direction. That is, at least a portion of the corner area CNA may be a double curved area in which a plurality of curvatures in a plurality of directions overlap each other. The display apparatus 1 may include a plurality of corner areas CNA.

The intermediate area MA may be disposed between the central area CA and the corner area CNA. The intermediate area MA may extend, between the first area A1 and the corner area CNA, in a direction in which the first area A1 extends. The intermediate area MA may extend, between the second area A2 and the corner area CNA, in a direction in which the second area A2 extends. The intermediate area MA may be bent. In addition, a driving circuit which provides electric signals to a pixel PX may be arranged in the intermediate area MA. A power line which provides power to a pixel PX may be arranged in the intermediate area MA. When desired, a pixel PX arranged in the intermediate area MA may overlap the driving circuit and/or the power line.

The peripheral area PA may be disposed outside the central area CA. Specifically, the peripheral area PA may be disposed outside the first area A1 and the second area A2. A pixel PX may not be arranged in the peripheral area PA. That is, the peripheral area PA may be a non-display area in which images are not displayed. The driving circuit which provides electric signals to a pixel PX may be arranged in the peripheral area PA. The power line which provides power to a pixel PX may be arranged in the peripheral area PA.

As shown in FIG. 2A, a portion of the corner area CNA, the intermediate area MA, and the first area A1 may be bent at a first curvature radius R1. As shown in FIG. 2B, another portion of the corner area CNA, the intermediate area MA, and the second area A2 may be bent at a second curvature radius R2. As shown in FIG. 2C, another portion of the corner area CNA and the intermediate area MA may be bent at a third curvature radius R3.

Pixels PX may be arranged over the substrate 100. In an embodiment, a pixel PX may be implemented by a display element. The pixels PX may each include a red-sub pixel, a green sub-pixel, and a blue sub-pixel. In an alternative embodiment, the pixels PX may each include a red-sub pixel, a green sub-pixel, a blue sub-pixel, and a white sub-pixel.

The pixel PX may be arranged in at least one of the central area CA, the first area A1, the second area A2, the corner area CNA, and the intermediate area MA. In an embodiment, the plurality of pixels PX may be arranged in the central area CA, the first area A1, the second area A2, the corner area CNA, and the intermediate area MA. Accordingly, the display apparatus 1 may display images in the central area CA, the first area A1, the second area A2, the corner area CNA, and the intermediate area MA. When desired, the display apparatus 1 may display independent images respectively in the central area CA, the first area A1, the second area A2, the corner area CNA, and the intermediate area MA. In an alternative embodiment, the display apparatus 1 may display a portion of one image in each of the central area CA, the first area A1, the second area A2, the corner area CNA, and the intermediate area MA.

As described above, the display apparatus 1 may display images in not only the central area CA, but the first area A1, the second area A2, the corner area CNA, and the intermediate area MA. Accordingly, an area occupied by the display area, which is a region which displays images in the display apparatus 1, may be increased remarkably. In addition, because the display apparatus 1 may display images even in the corner CN that is bent, an aesthetic sense may be improved.

Figure 3:
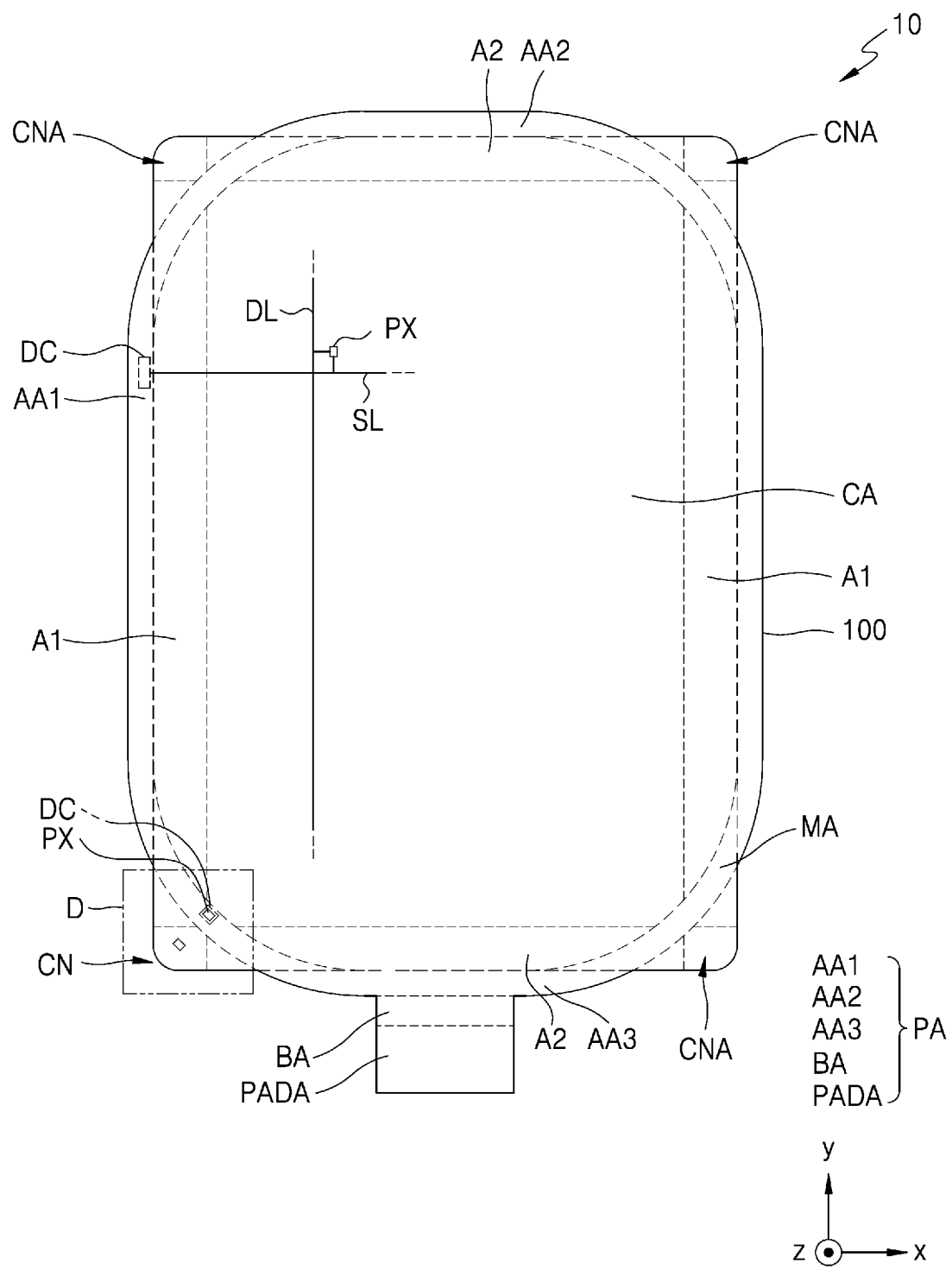
FIG. 3 is a schematic plan view of a portion of a display panel in the display apparatus of FIG. 1.

FIG. 3 is a schematic plan view of a portion of the display panel 10, which is a portion of the display apparatus 1 of FIG. 1. FIG. 3 schematically shows the display panel 10 that is unfolded, or not bent.

As described above, the peripheral area PA may be arranged outside the central area CA. The peripheral area PA may include a first adjacent area AA1, a second adjacent area AA2, a third adjacent area AA3, a bent area BA, and a pad area PADA.

The first adjacent area AA1 may be disposed outside the first area A1. That is, the first area A1 may be disposed between the first adjacent area AA1 and the central area CA. Accordingly, the first adjacent area AA1 may be disposed in the first direction from the first area A1, and, like the first area A1, may extend in the second direction. A driving circuit DC and/or a power line may be arranged in the first adjacent area AA1.

The second adjacent area AA2 and the third adjacent area AA3 may be disposed outside the second area A2. That is, the second areas A2 may be disposed between the second adjacent area AA2 and the central area CA, and between the third adjacent area AA3 and the central area CA. Like the second area A2, the second adjacent area AA2 and the third adjacent area AA3 may extend in the first direction. The second areas A2 and the central area CA may be disposed between the second adjacent area AA2 and the third adjacent area AA3.

The bent area BA may be disposed outside the third adjacent area AA3. That is, the third adjacent area AA3 may be disposed between the bent area BA and the second area A2. In addition, the pad area PADA may be arranged outside the bent area BA. That is, the bent area BA may be disposed between the third adjacent area AA3 and the pad area PADA. The display panel 10 may be bent in the bent area BA. In this case, the pad area PADA may overlap another portion of the display panel 10. Accordingly, the area of the peripheral area PA viewed to users may be reduced. A pad (not shown) may be arranged in the pad area PADA. The display panel 10 may receive electric signals and/or a power voltage through the pad.

Though it is shown in FIG. 3 that the display panel 10 is unfolded, or not bent, the display panel 10 may be bent in its portion as described above. That is, at least one of the first area A1, the second area A2, and the corner area CNA, and the intermediate area MA may be bent.

Specifically, the first area A1 may be bent around an axis extending in the second direction and bent in a cross-section (e.g., the zx cross-section) in the first direction, and may not be bent in a cross-section (e.g., the yz cross-section) in the second direction. The second area A2 may be bent around an axis extending in the first direction and bent in a cross-section (e.g., the yz cross-section) in the second direction, and may not be bent in a cross-section (e.g., the zx cross-section) in the first direction. As at least a portion of the corner area CNA is bent in both a cross-section (e.g., the zx cross-section) in the first direction and a cross-section (e.g., the yz cross-section) in the second direction, at least a portion of the corner area CNA may be a double-curved area in which a plurality of curvatures in a plurality of directions overlap each other.

When the corner area CNA is bent, more compressive strain may occur than tensile strain in the corner area CNA. Accordingly, a structure of the substrate 100 that is compressible needs to be applied to at least a portion of the corner area CNA. As a result, a structure of the display panel 10 in the corner area CNA may be different from a structure of the display panel 10 in the central area CA.

As described above, a pixel PX that may be arranged in at least one of the central area CA, but the first area A1, the second area A2, the corner area CNA, and the intermediate area MA, may include a display element. The display element may be an organic light-emitting diode ("OLED") including an organic emission layer. In an alternative embodiment, the display element may be a light-emitting diode ("LED") including an inorganic emission layer. The size of the LED may be microscale or nanoscale. In an embodiment, the LED may be a micro-LED. In an alternative embodiment, the LED may be a nanorod LED. The nanorod LED may include gallium nitride (GaN). When desired, a color-converting layer may be disposed on the display element. In this case, the color-converting layer may include quantum dots. In an alternative embodiment, the display element may be a quantum-dot LED including a quantum-dot emission layer. Hereinafter, for convenience of description, the case where the display element includes an OLED is described.

The pixel PX may include a plurality of sub-pixels, and each of the plurality of sub-pixels may emit light of a preset color by the display element. A sub-pixel is a minimum unit that implements an image and denotes an emission area. In the case where the OLED is used as the display element, the emission area may be defined by an opening of a pixel-defining layer. This is described below.

The driving circuit DC may provide signals to the pixels PX. In an embodiment, the driving circuit DC may be a scan driving circuit which provides scan signals to pixel circuits electrically connected to sub-pixels of a pixel PX through a scan line SL. In an alternative embodiment, the driving circuit DC may be an emission control driving circuit which provides emission control signals to pixel circuits electrically connected to sub-pixels through an emission control line (not shown). In an alternative embodiment, the driving circuit DC may be a data driving circuit which provides data signals to pixel circuits electrically connected to sub-pixels through the data line DL. Though not shown, the data driving circuit may be arranged in the third adjacent area AA3 or the pad area PADA. In an alternative embodiment, the data driving circuit may be disposed on a display circuit board connected through the pad.

Figure 4:
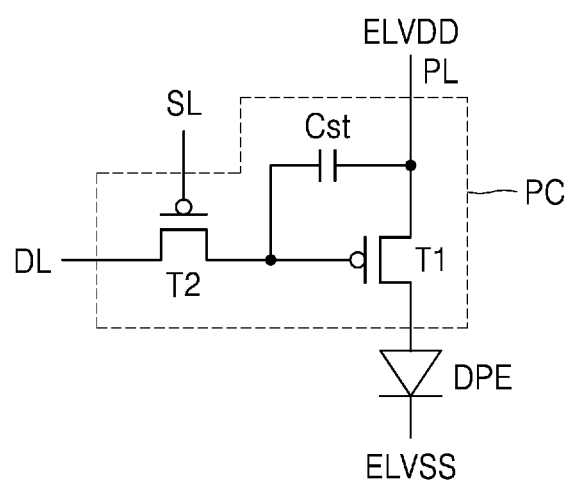
FIG. 4 is an equivalent circuit diagram of an embodiment of a pixel circuit in the display apparatus of FIG. 1.

FIG. 4 is an equivalent circuit diagram of an embodiment of the pixel circuit PC included in the display apparatus 1 of FIG. 1. That is, FIG. 4 is an equivalent circuit diagram of the pixel circuit PC electrically connected to an OLED, which is a display element DPE forming a sub-pixel of the display apparatus 1 of FIG. 1. The pixel circuit PC electrically connected to a sub-pixel may include a driving thin-film transistor T1, a switching thin-film transistor T2, and a storage capacitor Cst. In an embodiment, the display element DPE may emit red, green, or blue light, or emit red, green, blue, or white light, for example.

The switching thin-film transistor T2 is connected to a scan line SL and a data line DL, and transfers a data voltage or a data signal to the driving thin-film transistor T1 according to a switching voltage or a switching signal input from the scan line SL, the data voltage or the data signal being input from the data line DL.

The storage capacitor Cst may be connected to the switching thin-film transistor T2 and a driving voltage line PL and may store a voltage corresponding to a difference between a voltage transferred from the switching thin-film transistor T2 and a first power voltage ELVDD supplied to the driving voltage line PL.

The driving thin-film transistor T1 may be connected to the driving voltage line PL and the storage capacitor Cst, and may control a driving current flowing from the driving voltage line PL to the OLED, according to the voltage stored in the storage capacitor Cst. The display element DPE may emit light having a preset brightness based on the driving current. The opposite electrode of the display element DPE may receive a second power voltage ELVSS.

Though it is shown in FIG. 4 that the pixel circuit PC includes two thin-film transistors and one storage capacitor, the pixel circuit PC may include three or more thin-film transistors.

Figure 5:
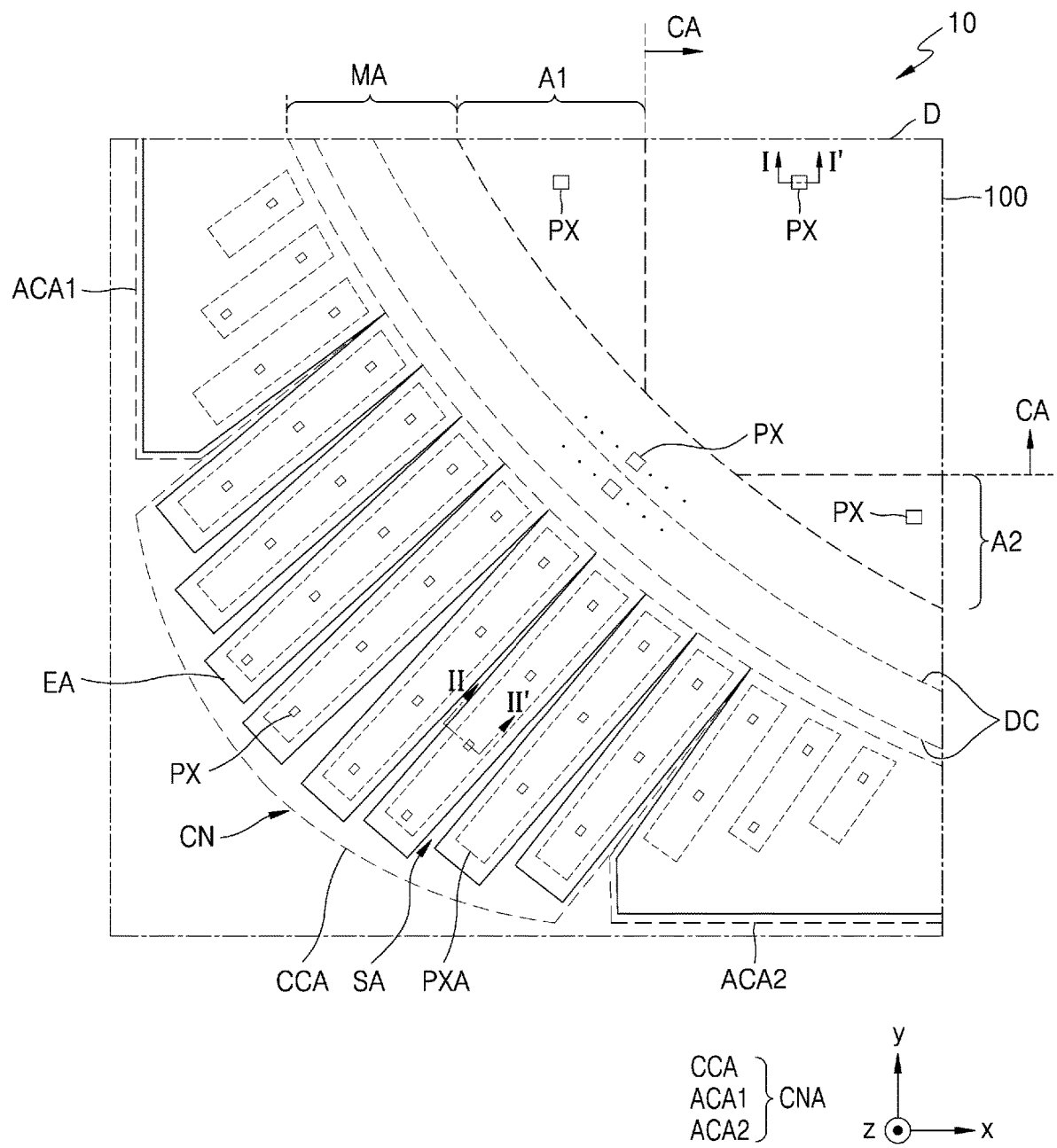
FIG. 5 is an enlarged conceptual view of a region D of FIG. 3.
Figure 6:
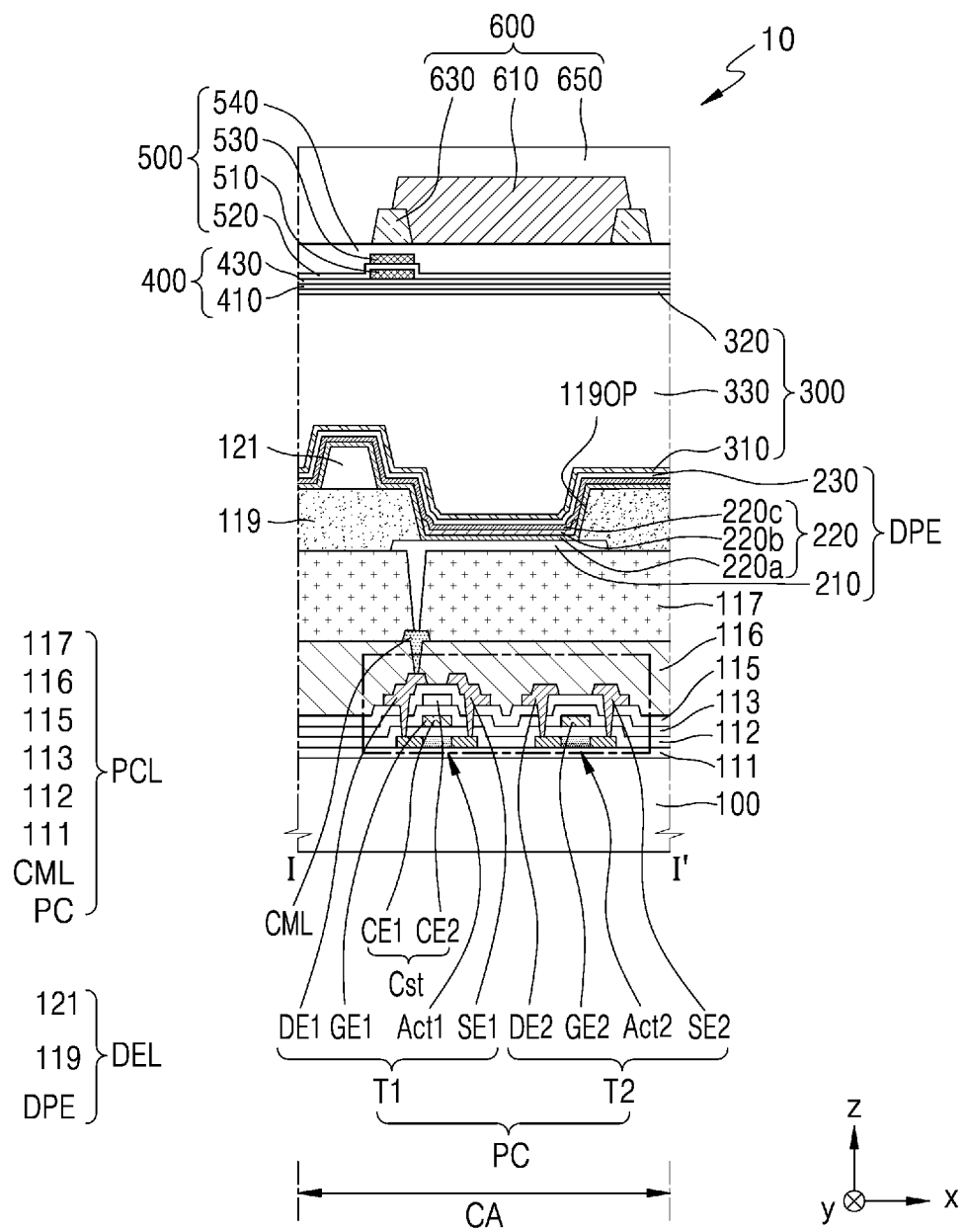
FIG. 6 is a schematic cross-sectional view of the display panel, taken along line I-I' of FIG. 5.

FIG. 5 is an enlarged conceptual view of a region D of FIG. 3, and FIG. 6 is a schematic cross-sectional view of the display panel 10, taken along line I-I' of FIG. 5.

As shown in FIGS. 5 and 6, the display panel 10 of the display apparatus 1 may include the substrate 100, a pixel circuit layer PCL, a display element layer DEL, an encapsulation layer 300, a protective layer 400, a touch sensor layer 500, and an anti-reflection layer 600.

The substrate 100 may include the central area CA, the first area A1, the second area A2, the corner area CNA, and the intermediate area MA.

The first area A1 may be adjacent to the central area CA in the first direction (e.g., the x direction or the −x direction). The first area A1 may extend in the second direction (e.g., the y direction or the −y direction). The second area A2 may be adjacent to the central area CA in the second direction. The second area A2 may extend in the first direction.

The corner area CNA may be a region arranged in a corner CN. That is, the corner area CNA may be a region where an edge of the display apparatus 1 in the first direction meets an edge of the display panel 10 in the second direction. The corner area CNA may surround at least a portion of the central area CA, the first area A1, and the second area A2. In an alternative embodiment, the corner area CNA may surround at least a portion of the central area CA, the first area A1, the second area A2, and the intermediate area MA. The corner area CNA may include a central corner area CCA, a first adjacent corner area ACA1, and a second adjacent corner area ACA2.

The central corner area CCA may include an extension area EA. The extension area EA may extend in a direction away from the central area CA. The display panel 10 may include a plurality of extension areas EA. Each of the plurality of extension areas EA may extend in a direction away from the central area CA. In an embodiment, the plurality of extension areas EA may extend in a direction crossing the first direction (e.g., the x direction or the −x direction) and the second direction (e.g., the y direction or the −y direction) in a plan view.

A separation area SA may be defined between the adjacent extension areas EA. The separation area SA may be a region in which elements of the display panel 10 are not arranged. When the central corner area CCA is bent in the corner CN, more compressive strain may occur than tensile strain in the central corner area CCA. However, because the separation area SA is defined between the adjacent extension areas EA, the display panel 10 may be bent without being damaged in the central corner area CCA.

The first adjacent corner area ACA1 may be adjacent to the central corner area CCA. At least a portion of the first area A1 and the first adjacent corner area ACA1 may be disposed in the first direction (e.g., the x direction or the −x direction). An end of the first adjacent corner area ACA1 in the direction of the central corner area CCA may be apart from an end of the central corner area CCA in the direction of the first adjacent corner area ACA1. The first adjacent corner area ACA1 may be bent in the cross-section (the zx cross-section) in the first direction, and may not be bent in the cross-section (the yz cross-section) in the second direction. The separation area SA may not be defined inside the first adjacent corner area ACA1.

The second adjacent corner area ACA2 may be adjacent to the central corner area CCA. At least a portion of the second area A2 and the second adjacent corner area ACA2 may be disposed in the second direction (e.g., the y direction or the −y direction). An end of the second adjacent corner area ACA2 in the direction of the central corner area CCA may be apart from an end of the central corner area CCA in the direction of the second adjacent corner area ACA2. The second adjacent corner area ACA2 may not be bent in the cross-section (the zx cross-section) in the first direction, and may be bent in the cross-section (the yz cross-section) in the second direction. The separation area SA may not be defined inside the second adjacent corner area ACA2.

The intermediate area MA may be disposed between the central area CA and the corner area CNA. The intermediate area MA may extend between the central area CA and the first adjacent corner area ACA1. In addition, the intermediate area MA may extend between the central area CA and the second adjacent corner area ACA2. The intermediate area MA may surround at least a portion of the central area CA, the first area A1, and the second area A2.

As shown in FIG. 5, the plurality of pixels PX may be arranged in the central area CA, the first area A1, the second area A2, the corner area CNA, and the intermediate area MA. Accordingly, the display panel 10 may display images in the central area CA, the first area A1, the second area A2, the corner area CNA, and the intermediate area MA. Each of the plurality of extension areas EA may include a pixel area PXA. The plurality of pixels PX may be arranged in the pixel area PXA. The plurality of pixels PX may be arranged in the extension direction of the extension area EA in each of the plurality of extension areas EA. The pixel PX may include the display element DPE.

The driving circuit which provides electric signals to a pixel PX and/or the power line which provides power to a pixel PX may be arranged in the intermediate area MA. The driving circuit DC may be provided in plural. The driving circuit DC may extend in a direction in which the intermediate area MA extends. The driving circuit DC may surround at least a portion of the central area CA, the first area A1, and the second area A2.

The pixel PX arranged in the intermediate area MA may overlap the driving circuit DC and/or the power line. In this case, the intermediate area MA may serve as a display area even when the driving circuit DC and/or the power line are arranged. However, the invention is not limited thereto. In an embodiment, the driving circuit DC and/or the power line may not be arranged in the intermediate area MA. In this case, the pixel PX arranged in the intermediate area MA may not overlap the driving circuit DC and/or the power line.

The substrate 100 may include a polymer resin such as polyethersulfone, polyarylate, polyetherimide, polyethylene naphthalate, polyethylene terephthalate, polyphenylene sulfide, polyimide, polycarbonate, cellulose tri acetate, or cellulose acetate propionate. In an alternative embodiment, the substrate 100 may include two layers including the polymer resin, and a barrier layer therebetween. In this case, the barrier layer may include an inorganic material such as silicon nitride ($SiN_x$), silicon oxide ($SiO_2$), and/or silicon oxynitride (SiON). Unlike this, the substrate 100 may include glass or metal.

The pixel circuit layer PCL may be disposed on the substrate 100. The pixel circuit layer PCL may include the pixel circuit PC, a buffer layer 111, a first gate insulating layer 112, a second gate insulating layer 113, an inter-insulating layer 115, a first planarization layer 116, a second planarization layer 117, and a connection electrode CML. The pixel circuit PC may include at least one thin-film transistor. Specifically, the pixel circuit PC may include a driving thin-film transistor T1, a switching thin-film transistor T2, and a storage capacitor Cst.

The driving thin-film transistor T1 may include a first semiconductor layer Act1, a first gate electrode GE1, a first source electrode SE1, and a first drain electrode DE1. The pixel circuit layer PCL may further include the buffer layer 111, the first gate insulating layer 112, the second gate insulating layer 113, the inter-insulating layer 115, the first planarization layer 116, and the second planarization layer 117 disposed on and/or under the elements of the driving thin-film transistor T1.

The buffer layer 111 may reduce or block penetration of foreign materials, moisture, or external air from below the substrate 100 and provide a flat surface on the substrate 100. The buffer layer 111 may include an inorganic material, an organic material, or an organic/inorganic composite material, and include a single layer or a multi-layer including an inorganic material and an organic material, the inorganic material including oxide or nitride.

The first semiconductor layer Act1 may be disposed on the buffer layer 111. The first semiconductor layer Act1 may include polycrystalline silicon. In an alternative embodiment, the first semiconductor layer Act1 may include amorphous silicon, an oxide semiconductor, or an organic semiconductor. The first semiconductor layer Act1 may include a channel region, a drain region, and a source region, the drain region and the source region being on two opposite sides of the channel region.

The first gate electrode GE1 may overlap the channel region. The first gate electrode GE1 may include a low-resistance metal material. The first gate electrode GE1 may include a conductive material including at least one of molybdenum (Mo), aluminum (Al), copper (Cu), and titanium (Ti) and have a single-layered structure or a multi-layered structure including the above materials.

The first gate insulating layer 112 may be arranged between the first semiconductor layer Act1 and the first gate electrode GE1. The first gate insulating layer 112 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide (ZnO or $ZnO_2$).

The second gate insulating layer 113 may cover the first gate electrode GE1. The second gate insulating layer 113 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide (ZnO or $ZnO_2$).

A second capacitor electrode CE2 of the storage capacitor Cst may be arranged on the second gate insulating layer 113. The second capacitor electrode CE2 may overlap the first gate electrode GE1 therebelow. In this case, the first gate electrode GE1 of the thin-film transistor T1 and the second capacitor electrode CE2 overlapping each other with the second gate insulating layer 113 therebetween may constitute the storage capacitor Cst. That is, the first gate electrode GE1 of the thin-film transistor T1 may serve as the first capacitor electrode CE1 of the storage capacitor Cst, and the storage capacitor Cst may overlap the driving thin-film transistor T1. However, the invention is not limited thereto. In an embodiment, the storage capacitor Cst may not overlap the driving thin-film transistor T1. The second capacitor electrode CE2 may include aluminum (Al), platinum (Pt), palladium (Pd), silver (Ag), magnesium (Mg), gold (Au), nickel (Ni), neodymium (Nd), iridium (Ir), chrome (Cr), calcium (Ca), molybdenum (Mo), titanium (Ti), tungsten (W), and/or copper (Cu), and include a single layer or a multi-layer including the above materials.

The inter-insulating layer 115 may cover the second capacitor electrode CE2. The inter-insulating layer 115 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide (ZnO or $ZnO_2$).

The first drain electrode DE1 and the first source electrode SE1 may each be arranged on the inter-insulating layer 115. The first drain electrode DE1 and the first source electrode SE1 may each include a material having high conductivity. The first source electrode SE1 and the first drain electrode DE1 may each include a conductive material including at least one of molybdenum (Mo), aluminum (Al), copper (Cu), and titanium (Ti) and have a single-layered structure or a multi-layered structure including the above materials. In an embodiment, the first source electrode SE1 and the first drain electrode DE1 may each have a multi-layered structure of Ti/Al/Ti.

The switching thin-film transistor T2 may include a second semiconductor layer Act2, a second gate electrode GE2, a second drain electrode DE2, and a second source electrode SE2. Because the second semiconductor layer Act2, the second gate electrode GE2, the second drain electrode DE2, and the second source electrode SE2 are respectively similar to the first semiconductor layer Act1, the first gate electrode GE1, the first drain electrode DE1, and the first source electrode SE1, detailed descriptions thereof are omitted.

The pixel circuit layer PCL may further include the driving circuit DC, and the driving circuit DC may be arranged in the intermediate area MA. The driving circuit DC may include at least one thin-film transistor, and be connected to a scan line. Similar to the switching thin-film transistor T2, a thin-film transistor included in the driving circuit DC may include a driving circuit semiconductor layer, a driving circuit gate electrode, a driving circuit source electrode, and a driving circuit drain electrode.

The first planarization layer 116 may cover the first drain electrode DE1 and the first source electrode SE1. The first planarization layer 116 may have an approximately flat upper surface. The first planarization layer 116 may include an organic material. In an embodiment, the first planarization layer 116 may include a general-purpose polymer such as benzocyclobutene ("BCB"), polyimide, hexamethyldisiloxane ("HMDSO"), polymethylmethacrylate ("PMMA") or polystyrene ("PS"), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or any combinations thereof. When desired, the first planarization layer 116 may include an inorganic material. In this case, the first planarization layer 116 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide (ZnO or $ZnO_2$). In the case where the first planarization layer 116 includes an inorganic material, chemical planarization polishing may be performed depending on the case. The first planarization layer 116 may include both an organic material and an inorganic material.

The pixel circuit layer PCL may further include the connection electrode CML, and the connection electrode CML may be disposed on the first planarization layer 116. In this case, the connection electrode CML may be connected to the first drain electrode DE1 or the first source electrode SE1 through a contact hole of the first planarization layer 116. The connection electrode CML may include a material having a high conductivity. The connection electrode CML may include a conductive material including at least one of molybdenum (Mo), aluminum (Al), copper (Cu), and titanium (Ti) and have a single-layered structure or a multi-layered structure including the above materials. In an embodiment, the connection electrode CML may have a multi-layered structure of Ti/Al/Ti.

The second planarization layer 117 may cover the connection electrode CML. The second planarization layer 117 may have an approximately flat upper surface. The second planarization layer 117 may include an organic material. In an embodiment, the second planarization layer 117 may include a general-purpose polymer such as benzocyclobutene ("BCB"), polyimide, hexamethyldisiloxane ("HMDSO"), polymethylmethacrylate ("PMMA") or polystyrene ("PS"), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or any combinations thereof. When desired, the second planarization layer 117 may include an inorganic material. In this case, the second planarization layer 117 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide (ZnO or $ZnO_2$). In the case where the second planarization layer 117 includes an inorganic material, chemical planarization polishing may be performed depending on the case. The second planarization layer 117 may include both an organic material and an inorganic material.

The display element layer DEL may be disposed on the pixel circuit layer PCL. The display element layer DEL may include the display element DPE, a pixel-defining layer 119, and a spacer 121. An OLED, which is the display element DPE, may include a pixel electrode 210, an opposite electrode 230, an intermediate layer 220 therebetween, the intermediate layer 220 including an emission layer.

The pixel electrode 210 may be disposed on the second planarization layer 117 having a flat upper surface. The pixel electrode 210 may be electrically connected to the connection electrode CML through a contact hole defined in the second planarization layer 117. In addition, as shown in FIG. 6, an OLED, which is the display element DPE, may overlap the pixel circuit PC electrically connected thereto in the central area CA.

The pixel electrode 210 may be a (semi) light-transmissive electrode or a reflective electrode. In an embodiment, the pixel electrode 210 may include a reflective layer and a transparent or semi-transparent electrode layer on the reflective layer, and the reflective layer includes at least one of Ag, Mg, Al, Pt, Pd, Au, Ni, Nd, Ir, Cr, and combination thereof. The transparent or semi-transparent electrode layer may include at least one of indium tin oxide ("ITO"), indium zinc oxide ("IZO"), zinc oxide (ZnO or $ZnO_2$), indium oxide ($In_2O_3$), indium gallium oxide ("IGO"), or aluminum zinc oxide ("AZO"). In an embodiment, the pixel electrode 210 may have a stack structure of ITO/Ag/ITO.

The pixel-defining layer 119 may be disposed on the second planarization layer 117. The pixel-defining layer 119 may define an emission area of a pixel by defining an opening 1190P that exposes the central portion of the pixel electrode 210. In addition, the pixel-defining layer 119 may prevent arcs or the like from occurring at the edges of each pixel electrode 210 by increasing a distance between the edges of each pixel electrode 210 and the opposite electrode 230 over the pixel electrode 210. The pixel-defining layer 119 may include an organic insulating material such as polyimide, an acryl resin, benzocyclobutene, and hexamethyldisiloxane ("HMDSO"), and be formed by spin coating or the like.

The intermediate layer 220 may be disposed on the pixel-defining layer 119. The intermediate layer 220 may be disposed in the opening of the pixel-defining layer 119, and include an emission layer 220b that overlaps the pixel electrode 210. The intermediate layer 220 may further include at least one of a first functional layer 220a and a second functional layer 220c, and the first functional layer 220a is disposed between the pixel electrode 210 and the emission layer 220b, and the second functional layer 220c is disposed on the emission layer 220b. The first functional layer 220a may include a hole transport layer ("HTL"), or include an HTL and a hole injection layer ("HIL"), for example. The second functional layer 220c may include an electron transport layer ("ETL") and/or an electron injection layer ("EIL"). The first functional layer 220a and/or the second functional layer 220c may be formed or provided as one body to correspond to the plurality of pixel electrodes 210.

The opposite electrode 230 may be a light-transmissive electrode or a reflective electrode. In an embodiment, the opposite electrode 230 may be a transparent or semi-transparent electrode and may include a thin metal film including Li, Ca, LiF, Al, Ag, Mg, or any combinations thereof and having a small work function. In addition, a transparent conductive oxide ("TCO") such as ITO, IZO, ZnO, or $In_2O_3$ may be further included beside the thin metal film. The opposite electrode 230 may be formed or provided as one body to correspond to the plurality of pixel electrodes 210.

The spacer 121 may be disposed on the pixel-defining layer 119. The spacer 121 may be for preventing destruction of the substrate 100 and/or a multi-layer on the substrate 100 in the method of manufacturing the display apparatus. In the method of manufacturing the display panel, a mask sheet may be used. In this case, the mask sheet may enter the inside of the opening 1190P of the pixel-defining layer 119, or be closed attached to the pixel-defining layer 119. The spacer 121 may prevent or reduce defects that a portion of the substrate 100 and the multi-layer is damaged or destroyed by the mask sheet while a deposition material is deposited on the substrate 100.

The spacer 121 may include an organic material such as polyimide. In an alternative embodiment, the spacer 121 may include an inorganic insulating material such as silicon nitride ($SiN_x$) or silicon oxide ($SiO_2$), or include an organic insulating material and an inorganic insulating material. The spacer 121 may include a material different from that of the pixel-defining layer 119. In an alternative embodiment, the spacer 121 includes the same material as that of the pixel-defining layer 119. In this case, the pixel-defining layer 119 and the spacer 121 may be simultaneously formed during a mask process that uses a half-tone mask or the like.

An encapsulation layer 300 may be disposed on the opposite electrode 230, and the encapsulation layer 300 includes a first inorganic encapsulation layer 310, a second inorganic encapsulation layer 320, and an organic encapsulation layer 330 therebetween.

The first inorganic encapsulation layer 310 and the second inorganic encapsulation layer 320 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide (ZnO or $ZnO_2$). The organic encapsulation layer 330 may include polyethylene terephthalate, polyethylene naphthalate, polycarbonate, polyimide, polyethylene sulfonate, polyoxymethylene, polyarylate, hexamethyldisiloxane, an acryl-based resin (e.g., polymethylmethacrylate, poly acrylic acid, or the like), or an any combinations thereof.

The protective layer 400 may be disposed on the encapsulation layer 300. The protective layer 400 may protect the encapsulation layer 300. In an embodiment, the protective layer 400 may prevent or reduce occurrence of cracks in at least one of the first inorganic encapsulation layer 310 and/or the second inorganic encapsulation layer 320. A second inorganic protective layer 430 may be disposed on a first inorganic protective layer 410.

The first inorganic protective layer 410 and the second inorganic protective layer 430 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide (ZnO or $ZnO_2$).

The touch sensor layer 500 may be arranged on the protective layer 400. The touch sensor layer 500 may obtain coordinate information corresponding to an external input, e.g., a touch event. The touch sensor layer 500 may include a first touch conductive layer 510, a first touch insulating layer 520, a second touch conductive layer 530, and a second touch insulating layer 540.

The first touch conductive layer 510 may be disposed on the second inorganic protective layer 430. The first touch conductive layer 510 may include a conductive material. Specifically, the first touch conductive layer 510 may include at least one of molybdenum (Mo), aluminum (Al), copper (Cu), and titanium (Ti). In an embodiment, the first touch conductive layer 510 may have a structure of Ti/Al/Ti in which a titanium layer, an aluminum layer, and a titanium layer are sequentially stacked.

The first touch insulating layer 520 may be disposed on the first touch conductive layer 510. The first touch insulating layer 520 may include an inorganic material. In an embodiment, the first touch insulating layer 520 may include at least one inorganic material among aluminum oxide ($Al_2O_3$), titanium oxide ($TiO_2$), tantalum oxide ($Ta_2O_5$), hafnium oxide ($HfO_2$), zinc oxide (ZnO), silicon oxide ($SiO_2$), silicon nitride ($SiN_x$), and silicon oxynitride (SiON).

The second touch conductive layer 530 may be disposed on the first touch insulating layer 520. A contact hole may be defined in the first touch insulating layer 520, and the second touch conductive layer 530 may be connected to the first touch conductive layer 510 through the contact hole. The second touch conductive layer 530 may include a conductive material. Specifically, the second touch conductive layer 530 may include at least one of molybdenum (Mo), aluminum (Al), copper (Cu), and titanium (Ti). In an embodiment, the second touch conductive layer 530 may have a structure of Ti/Al/Ti in which a titanium layer, an aluminum layer, and a titanium layer are sequentially stacked.

The second touch insulating layer 540 may be disposed on the second touch conductive layer 530. An upper surface of the second touch insulating layer 540 may be flat. The second touch insulating layer 540 may include an organic material. Specifically, the second touch insulating layer 540 may include a polymer-based material. The polymer-based material may be transparent. In an embodiment, the second touch insulating layer 540 may include a silicon-based resin, an acryl-based resin, an epoxy-based resin, polyimide, and a polyethylene. The second touch insulating layer 540 may include an inorganic material.

The anti-reflection layer 600 may be disposed on the touch sensor layer 500. The anti-reflection layer 600 may reduce the reflectivity of light incident toward the display panel 10 from outside. The anti-reflection layer 600 may increase color purity of light emitted from the display panel 10. The anti-reflection layer 600 may include a color filter 610, a black matrix 630, and a planarization layer 650. The color filter 610 may overlap an OLED, which is the display element DPE. The color filter 610 may be arranged by taking into account a color of light emitted from the OLED. The color filter 610 may include red, green, or blue pigment or dye. In an alternative embodiment, the color filter 610 may further include quantum dots in addition to the pigment or dye. In an alternative embodiment, the color filter 610 may not include pigment or dye, and may include scattering particles such as titanium oxide.

The black matrix 630 may be adjacent to the color filter 610, and may overlap at least one of the first touch conductive layer 510 and the second touch conductive layer 530. The black matrix 630 may at least partially absorb external light or inner reflected light. The black matrix 630 may include black pigment.

The planarization layer 650 may be disposed on the color filter 610 and the black matrix 630. An upper surface of the planarization layer 650 may be flat. The planarization layer 650 may include an organic material. Specifically, the planarization layer 650 may include a transparent polymer-based material. In an embodiment, the planarization layer 650 may include a silicon-based resin, an acryl-based resin, an epoxy-based resin, polyimide, and a polyethylene.

Because the pixel PX disposed in the central area CA of FIG. 5 has been described with reference to FIG. 6, a structure near the separation area SA in the extension area EA, and the pixel PX disposed in the extension area EA are described with reference to FIG. 7, which is a schematic cross-sectional view of the pixel PX, taken along line II-II' of FIG. 5. Because same reference numerals in FIG. 6 as those in FIG. 7 denote same or corresponding members, descriptions thereof are omitted, for convenience of description.

Figure 7:
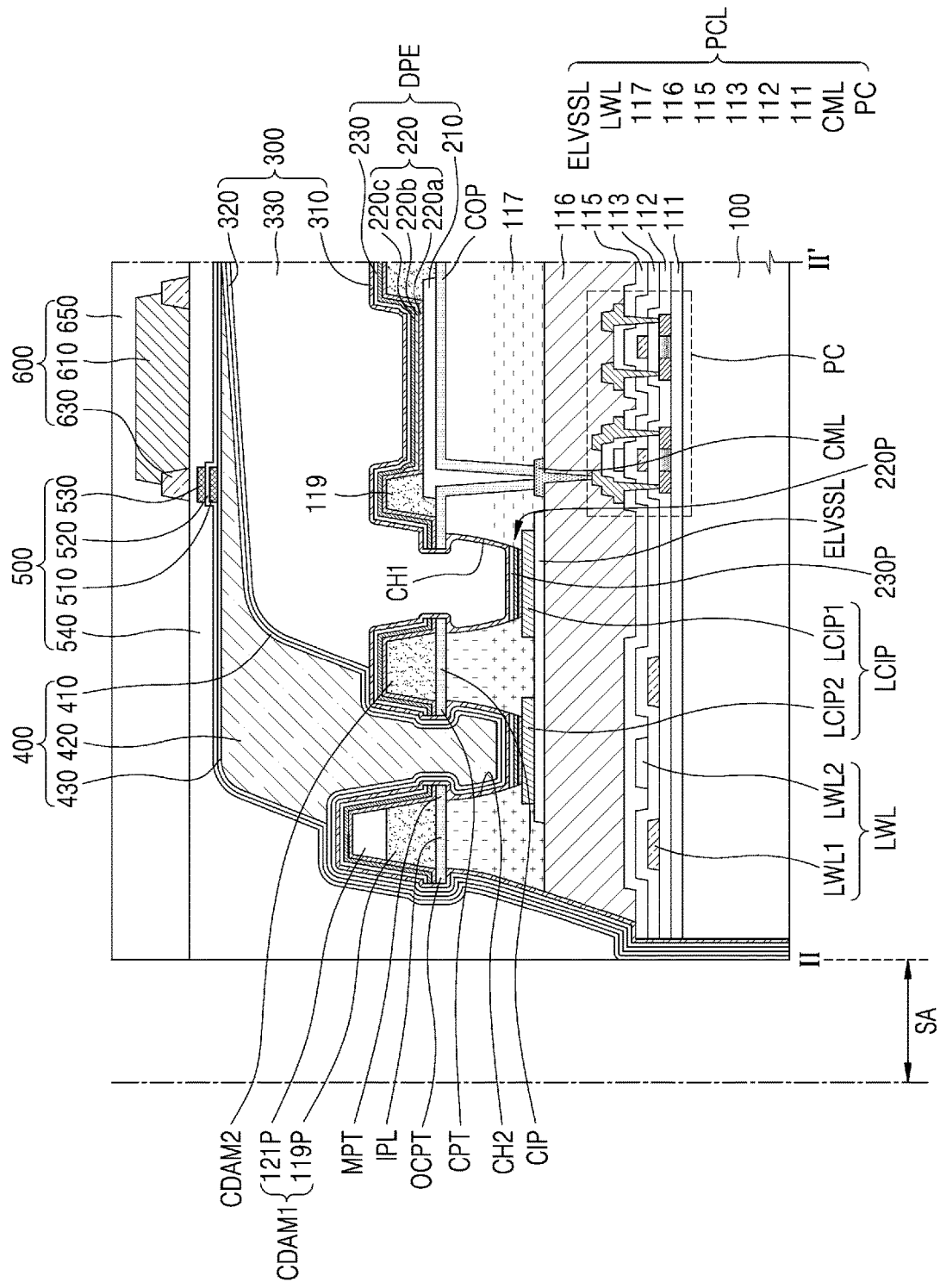
FIG. 7 is a schematic cross-sectional view of the display panel, taken along line II-II' of FIG. 5.

As shown in FIG. 7, the pixel circuit layer PCL may include the pixel circuit PC, a buffer layer 111, a first gate insulating layer 112, a second gate insulating layer 113, an inter-insulating layer 115, a first planarization layer 116, a second planarization layer 117, and a connection electrode CML. The pixel circuit layer PCL may further include a lower wiring LWL and an electrode power supply line ELVSSL.

The lower wiring LWL may transfer a power voltage and/or an electric signal to the pixels arranged in the corner area CNA. The lower wiring LWL may include a first lower wiring LWL1 and a second lower wiring LWL2. The first lower wiring LWL1 may be disposed between the first gate insulating layer 112 and the second gate insulating layer 113, and the second lower wiring LWL2 may be disposed between the second gate insulating layer 113 and the inter-insulating layer 115.

Like the connection electrode CML, the electrode power supply line ELVSSL may be disposed on the first planarization layer 116, and may include the same material as that of the connection electrode CML. The electrode power supply line ELVSSL may be electrically connected to the opposite electrode 230 of the OLED, which is the display element DPE, and may apply electric signals to the opposite electrode 230.

The second planarization layer 117 may cover the electrode power supply line ELVSSL and the connection electrode CML. As shown in FIG. 7, a first corner hole CH1 and a second corner hole CH2 may be defined in the second planarization layer 117. A contact hole may be defined in the second planarization layer 117, and the pixel electrode 210 on the second planarization layer 117 may be connected to the connection electrode CML through the contact hole. The first corner hole CH1, the second corner hole CH2, and the contact hole may be simultaneously defined.

The first corner hole CH1 and the second corner hole CH2 may overlap the electrode power supply line ELVSSL. A lower corner inorganic pattern LCIP on the electrode power supply line ELVSSL may prevent or reduce damage to the electrode power supply line ELVSSL during a process of forming the first corner hole CH1 and the second corner hole CH2. Specifically, the lower corner inorganic pattern LCIP may include a first lower corner inorganic pattern LCIP1 and a second lower corner inorganic pattern LCIP2. The first lower corner inorganic pattern LCIP1 may overlap the first corner hole CH1, and the second lower corner inorganic pattern LCIP2 may overlap the second corner hole CH2. Through this, the electrode power supply line ELVSSL is not exposed or an exposed degree is reduced during a process of forming the first corner hole CH1 and the second corner hole CH2. Accordingly, damage to the electrode power supply line ELVSSL may be prevented or reduced. The lower corner inorganic pattern LCIP may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$) or zinc oxide (ZnO or $ZnO_2$).

An overlap inorganic pattern COP, a corner inorganic pattern CIP, and an inorganic pattern line IPL may be disposed on the second planarization layer 117. The overlap inorganic pattern COP, the corner inorganic pattern CIP, and the inorganic pattern line IPL may be simultaneously formed or provided and may including the same material. The overlap inorganic pattern COP, the corner inorganic pattern CIP, and the inorganic pattern line IPL may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide (ZnO or $ZnO_2$).

The overlap inorganic pattern COP may be disposed on the second planarization layer 117 and disposed near a contact hole. As shown in FIG. 7, the overlap inorganic pattern COP may be disposed also on the inner surface of the contact hole. In this case, the pixel electrode 210 on the second planarization layer 117 may be disposed on the overlap inorganic pattern COP and connected to the connection electrode CML through the contact hole.

The corner inorganic pattern CIP may be apart from the overlap inorganic pattern COP by the first corner hole CH1, and may have a shape that at least partially surrounds the overlap inorganic pattern COP in a plan view. The inorganic pattern line IPL may be apart from the corner inorganic pattern CIP by the second corner hole CH2, and may have a shape that at least partially surrounds the corner inorganic pattern CIP in a plan view.

The corner inorganic pattern CIP may include a corner protrusion tip CPT that protrudes in a central direction of at least one of the first corner hole CH1 and the second corner hole CH2. It is shown in FIG. 7 that the corner inorganic pattern CIP protrudes in a central direction of each of the first corner hole CH1 and the second corner hole CH2. The inorganic pattern line IPL may include an intermediate protrusion tip MPT that protrudes in a central direction of the second corner hole CH2. In addition, the inorganic pattern line IPL may include an outer corner protrusion tip OCPT that protrudes in a direction of the separation area SA. As shown in FIG. 7, the overlap inorganic pattern COP may also include a protrusion tip that protrudes in a central direction of the first corner hole CH1.

The pixel-defining layer 119 may cover the edges of the pixel electrode 210. In this case, when forming the pixel-defining layer 119, a first pattern 119P may be simultaneously formed or provided and may include the same material as that of the pixel-defining layer 119. The first pattern 119P may be disposed on the inorganic pattern line IPL. The first pattern 119P and the inorganic pattern line IPL may constitute a first corner dam CDAM1. When forming the spacer 121 on the pixel-defining layer 119, a second pattern 121P on the first pattern 119P may be simultaneously formed or provided, and may include the same material as that of the spacer 121. In this case, the first pattern 119P and the second pattern 121P may constitute the first corner dam CDAM1 in cooperation with the inorganic pattern line IPL. In addition, when forming the pixel-defining layer 119, a second corner dam CDAM2 may be simultaneously formed or provided, and the second corner dam CDAM2 is apart from the first corner dam CDAM1, is disposed on the corner inorganic pattern CIP, and includes the same material as that of the pixel-defining layer 119.

Like the central area CA described above with reference to FIG. 6, the intermediate layer 220 may be disposed on the pixel-defining layer 119 also in the extension area EA. The intermediate layer 220 may be disposed in the opening of the pixel-defining layer 119, and include an emission layer 220b that overlaps the pixel electrode 210. The intermediate layer 220 may further include at least one of a first functional layer 220a and a second functional layer 220c, and the first functional layer 220a is disposed between the pixel electrode 210 and the emission layer 220b, and the second functional layer 220c is disposed on the emission layer 220b.

As described above, the overlap inorganic pattern COP may include a protrusion tip that protrudes in the central direction of the first corner hole CH1. In addition, the corner inorganic pattern CIP may include a corner protrusion tip CPT that protrudes in the central direction of the first corner hole CH1. Accordingly, when forming the first functional layer 220a and the second functional layer 220c, a functional layer pattern 220P may be formed or provided, and the functional layer pattern 220P is separated from the first functional layer 220a and the second functional layer 220c by the protrusion tip of the overlap inorganic pattern COP and the corner protrusion tip CPT of the corner inorganic pattern CIP, and disposed inside the first corner hole CH1. In addition, as described above, the inorganic pattern line IPL includes an intermediate protrusion tip MPT that protrudes in the central direction of the second corner hole CH2. Accordingly, when forming the first functional layer 220a and the second functional layer 220c, the functional layer pattern 220P may be formed or provided inside the second corner hole CH2 by the corner protrusion tip CPT and the intermediate protrusion tip MPT.

The opposite electrode 230 is formed or disposed on the pixel-defining layer 119 and the intermediate layer 220 to correspond to the plurality of pixel electrodes 210. Accordingly, for the same reason as the functional layer pattern 220P disposed in the first corner hole CH1 and the second corner hole CH2 is formed or provided, a common electrode pattern 230P disposed in the first corner hole CH1 and the second corner hole CH2 may be formed or provided.

The first inorganic encapsulation layer 310 of the encapsulation layer 300 may be disposed on the opposite electrode 230, and may directly contact the protrusion tip of the overlap inorganic pattern COP, the corner protrusion tip CPT of the corner inorganic pattern CIP, and the intermediate protrusion tip MPT of the inorganic pattern line IPL. Furthermore, as shown in FIG. 7, the first inorganic encapsulation layer 310 may contact the common electrode pattern 230P inside the first corner hole CH1 and the second corner hole CH2, and cover the inner surfaces of the first corner hole CH1 and the second corner hole CH2. The organic encapsulation layer 330 of the encapsulation layer 300 may be disposed on the first inorganic encapsulation layer 310, and may fill the first corner hole CH1 as shown in FIG. 7. The second corner dam CDAM2 may prevent a material for the organic encapsulation layer 330 from flowing to the outside during the manufacturing process. The second inorganic encapsulation layer 320 of the encapsulation layer 300 may be disposed on the organic encapsulation layer 330. The second inorganic encapsulation layer 320 may directly contact the first inorganic encapsulation layer 310 on the second corner dam CDAM2. When desired, the second inorganic encapsulation layer 320 may directly contact the first inorganic encapsulation layer 310 also in the second corner hole CH2.

The protective layer 400 may include the first inorganic protective layer 410, an organic protective layer 420, and the second inorganic protective layer 430. The first inorganic protective layer 410 may be disposed on the encapsulation layer 300, and the organic protective layer 420 may be disposed on the first inorganic protective layer 410. In addition, the second inorganic protective layer 430 may be disposed on the organic protective layer 420. The organic protective layer 420 may fill the second corner hole CH2. The second inorganic protective layer 430 may directly contact the first inorganic protective layer 410 on the first corner dam CDAM1. The first inorganic protective layer 410 and the second inorganic protective layer 430 may surround the corner protrusion tip CPT of the corner inorganic pattern CIP. In addition, the first inorganic protective layer 410 and the second inorganic protective layer 430 may surround the outer corner protrusion tip OCPT of the inorganic pattern line IPL. Through this, damage to the display apparatus due to external oxygen or moisture may be effectively prevented, and damage to the display apparatus due to external impacts may be prevented by increasing mechanical strength of the display apparatus.

The touch sensor layer 500 may be disposed on the protective layer 400. The touch sensor layer 500 may include the first touch conductive layer 510, the first touch insulating layer 520, the second touch conductive layer 530, and the second touch insulating layer 540. When desired, the second touch insulating layer 540 may overlap the outer corner protrusion tip OCPT of the inorganic pattern line IPL.

Like the central area CA described above with reference to FIG. 6, the anti-reflection layer 600 may be disposed on the touch sensor layer 500 also in the extension area EA. The anti-reflection layer 600 may include the color filter 610, the black matrix 630, and the planarization layer 650, for example. The color filter 610 may overlap the pixel electrode 210.

Figure 8A:
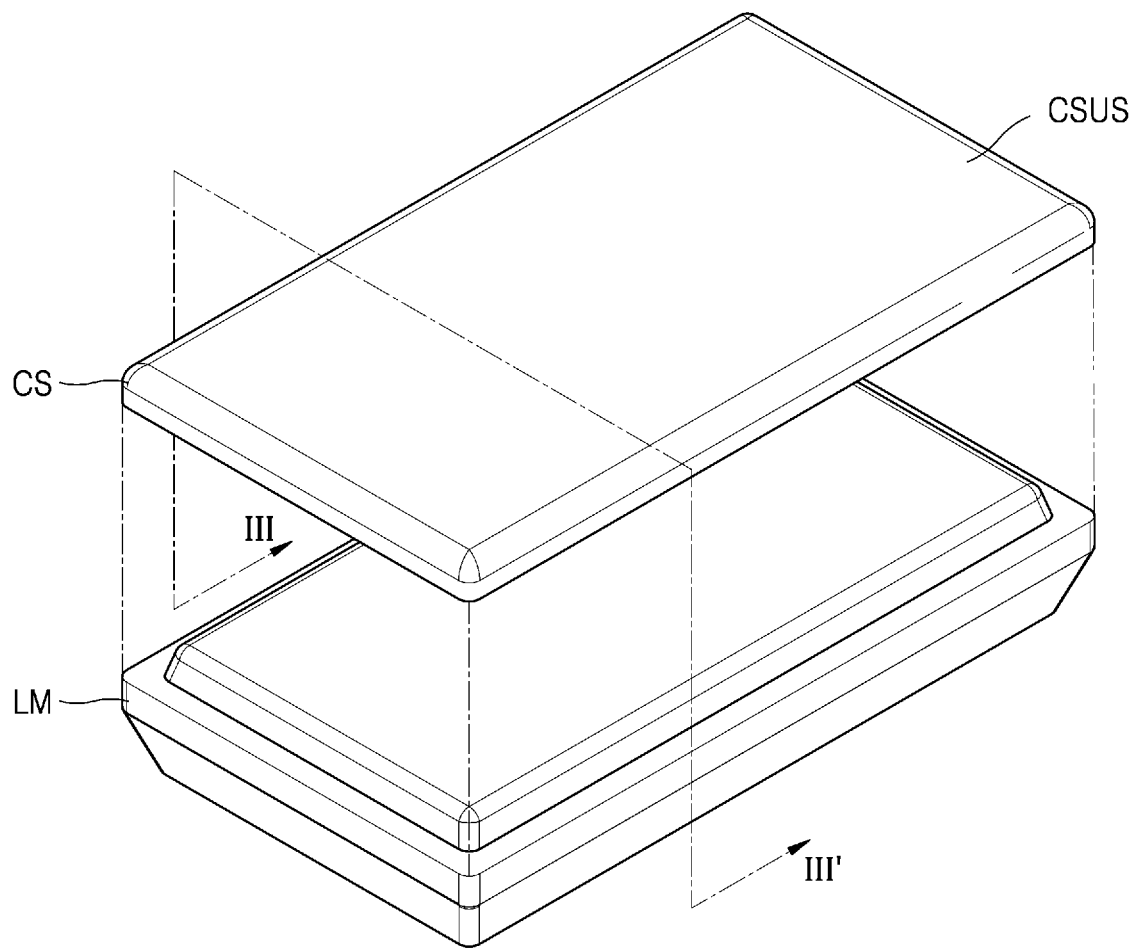
FIGS. 8A, 8B, 9, 10, 11, and 12 are schematic views showing an embodiment of a method of manufacturing a display apparatus.
Figure 8B:
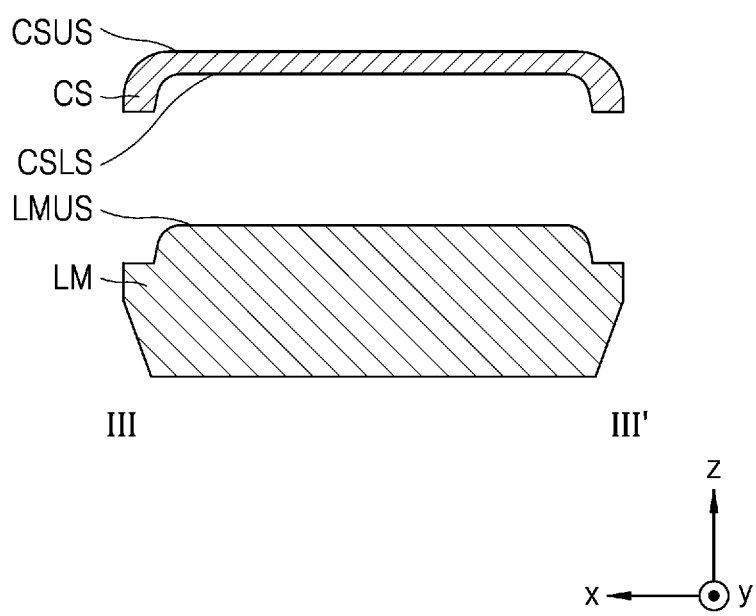

FIGS. 8A, 8B, 9, 10, 11, and 12 are schematic views showing an embodiment of a method of manufacturing a display apparatus. Specifically, FIG. 8A is an exploded perspective view of a combination of a lamination mold LM and a case CS to explain a disposing operation of the case CS in a method of manufacturing a display apparatus in an embodiment, and FIG. 8B is a schematic cross-sectional view of the lamination mold LM and the case CS, taken along line III-III' of FIG. 8A.

In the method of manufacturing the display apparatus in an embodiment, as shown in FIGS. 8A and 8B, the case CS may be disposed on the lamination mold LM. Specifically, the case CS may be disposed on the lamination mold LM such that an upper surface LMUS (in a +z direction) of the lamination mold LM faces a lower surface CSLS (in a −z direction) of the case CS. The upper surface LMUS of the lamination mold may have a shape corresponding to the lower surface CSLS of the case CS. Specifically, the upper surface LMUS of the lamination mold may have a shape engaged with the lower surface CSLS of the case CS. Accordingly, the lamination mold LM may be coupled to the case CS.

The upper surface CSUS (in the +z direction) of the case CS may have a shape corresponding to the indented portion 21 of the cover window 20. The case CS may include an elastic material. In an embodiment, the case CS may include at least one of silicone, polycarbonate, and polyurethane.

Figure 9:
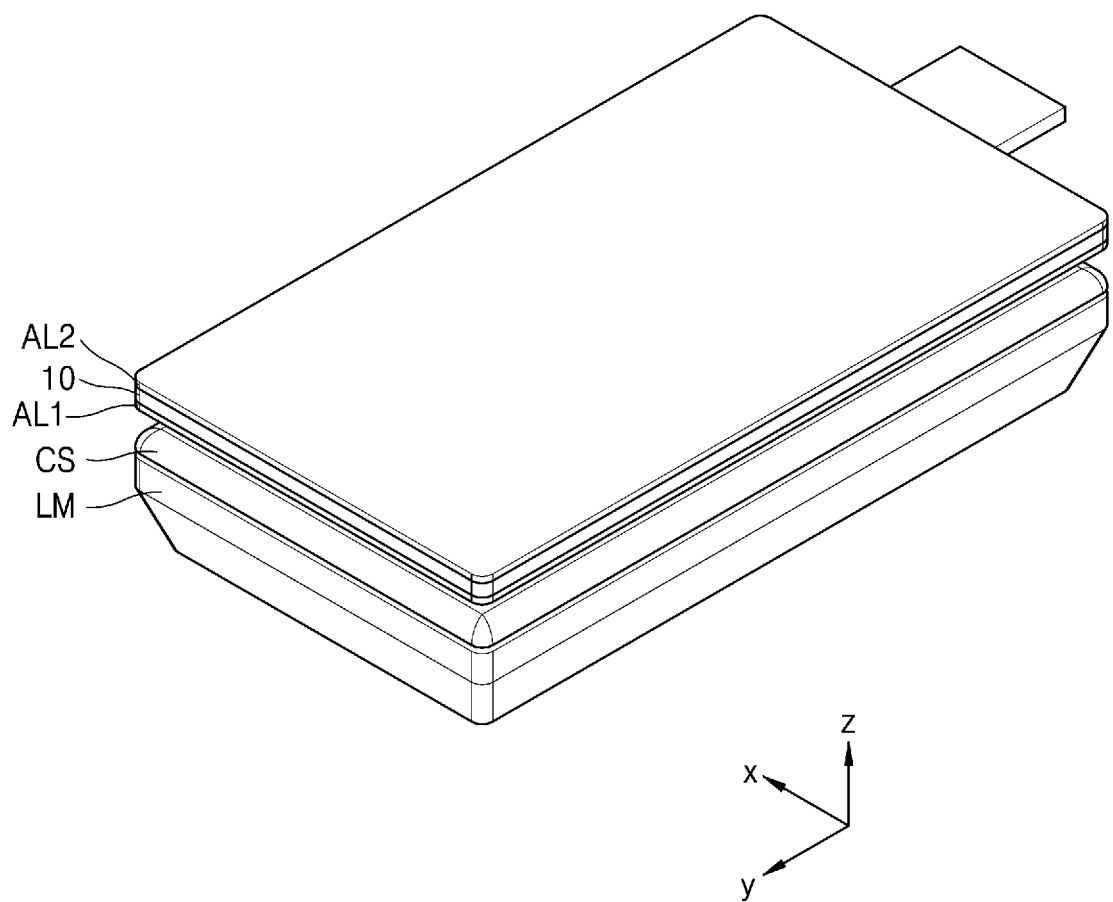

Subsequently, as shown in FIG. 9, the display panel 10 may be disposed on the combination of the lamination mold LM and the case CS, and at least a portion of the display panel 10 may be attached to the case CS. Specifically, the display panel 10 may be disposed on the case CS such that the corner area CNA of the display panel 10 corresponds to the corner of the case CS. That is, the extension areas EA of the display panel 10 may be disposed on the corner of the case CS. The separation areas SA defined between adjacent extension areas EA may be also disposed on the corner of the case CS.

In an operation of disposing the display panel 10 on the combination of the lamination mold LM and the case CS, the display panel 10 may be in a flat state without being bent. That is, in the operation of disposing the display panel 10 on the combination of the lamination mold LM and the case CS, the first area A1, the second area A2, the intermediate area MA, and the corner area CNA of the display panel 10 may not be bent in a preset direction. As described above, because the upper surface CSUS of the case CS has the shape corresponding to the indented portion 21 of the cover window 20, a portion of the upper surface CSUS of the case CS that corresponds to the central area CA of the display panel 10 may include a flat surface, and portions of the upper surface CSUS of the case CS that corresponds to the first area A1, the second area A2, the intermediate area MA, and the corner area CNA of the display panel 10 may include curved surfaces. Accordingly, the central area CA of the display panel 10 may contact the upper surface CSUS of the case CS, but the first area A1, the second area A2, the intermediate area MA, and the corner area CNA of the display panel 10 may include regions that do not contact the upper surface CSUS of the case CS.

A first adhesive layer AL1 may be disposed between the case CS and the display panel 10. The first adhesive layer AL1 may include an acryl-based resin. As described below, adhesive force of the first adhesive layer AL1 may be reduced when an ultraviolet ray is irradiated to the first adhesive layer AL1. A second adhesive layer AL2 may be disposed on the display panel 10. That is, the second adhesive layer AL2 may cover the upper surface of the display panel 10. The second adhesive layer AL2 may include at least one of an optically clear resin ("OCR"), an optical clear adhesive ("OCA"), and a pressure sensitive adhesive ("PSA").

Specifically, the display panel 10 is aligned to the second adhesive layer AL2 of a film type by an alignment key of the display panel 10, and then, the second adhesive layer AL2 of a film type may be attached to one side (e.g., an upper surface) of the display panel 10. Then, the display panel 10 may be disposed upside down such that one surface of the display panel 10 to which the second adhesive layer AL2 has been attached faces the −z direction. Subsequently, the display panel 10 is aligned to the first adhesive layer AL1 of a film type by an alignment key of the display panel 10, and then, the first adhesive layer AL1 of the film type may be attached to the opposite side of the one side of the display panel 10 to which the second adhesive layer AL2 has been attached. Then, the display panel 10 may be disposed such that one surface of the display panel 10 to which the second adhesive layer AL2 has been attached faces the +z direction. Accordingly, when the first adhesive layer AL1 is attached to the lower surface of the display panel 10, the second adhesive layer AL2 may be attached to the upper surface of the display panel 10. However, the invention is not limited thereto. In an embodiment, the display panel 10, to an upper surface of which the second adhesive layer AL2 has been attached may be disposed on the case CS, to an upper surface of which the first adhesive layer AL1 has been attached.

As described above, the display panel 10 is disposed such that the lower surface of the display panel 10 faces the upper surface CSUS of the case CS, and at least a portion of the display panel 10 may be attached to the case CS by the first adhesive layer AL1 disposed between the upper surface CSUS of the case CS and the lower surface of the display panel 10. Specifically, the central area CA of the display panel 10 is attached to the upper surface CSUS of the case CS, and at least some of the first area A1, the second area A2, and the intermediate area MA of the display panel 10 may not be attached to the upper surface CSUS of the case CS. Also, at least a portion of the corner area CNA of the display panel 10 may not be attached to the upper surface CSUS of the case CS.

Figure 10:
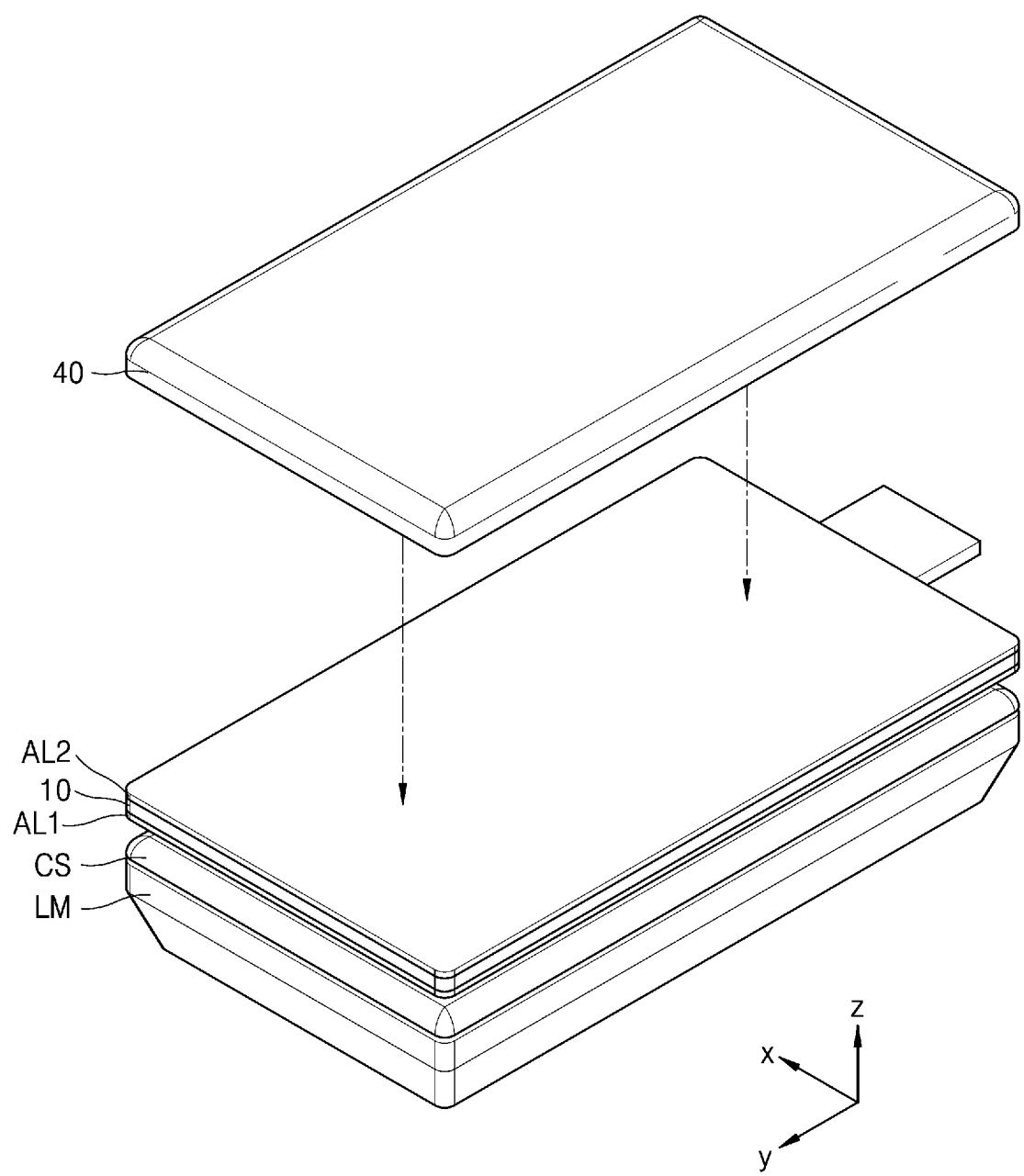
Figure 13:
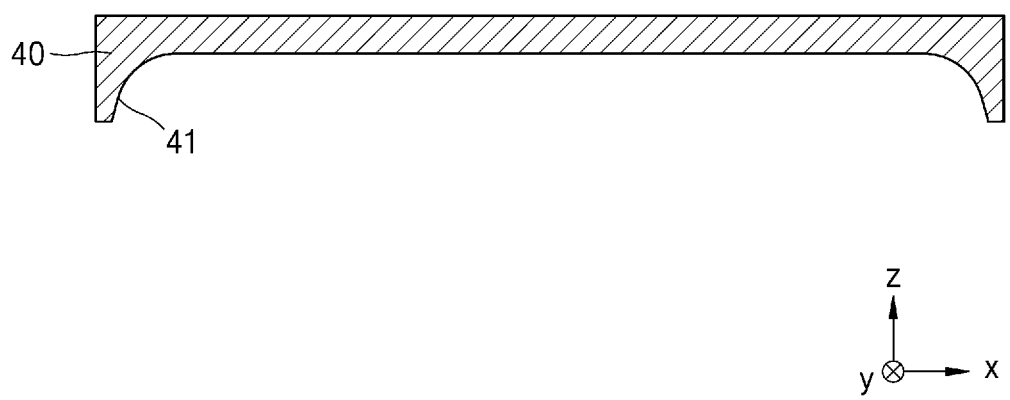
FIG. 13 is a cross-sectional view of an embodiment of a cap used in a method of manufacturing a display apparatus.
Figure 14:
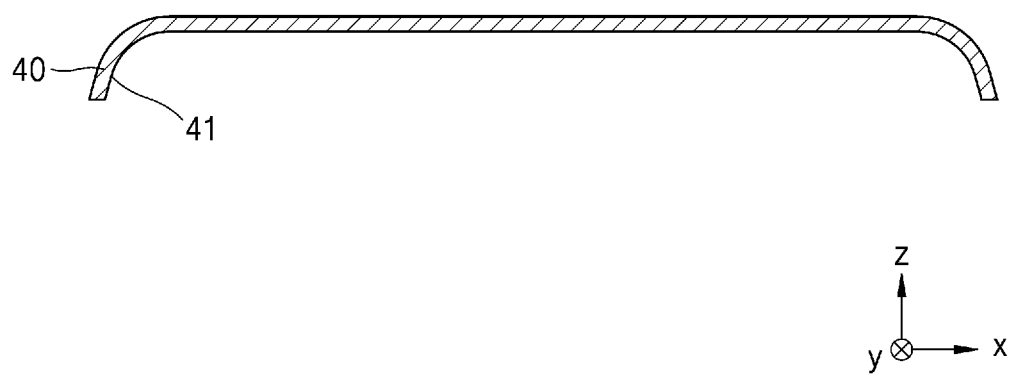
FIG. 14 is a cross-sectional view of an embodiment of a cap used in a method of manufacturing a display apparatus.

Subsequently, as shown in FIG. 10, the display panel 10 may be pressed by a cap 40. That is, the display panel 10 may be preliminarily formed by pressing the display panel 10 using the cap 40 and bending a portion of the display panel 10. Specifically, the cap 40 may be disposed on the display panel 10 such that the upper surface of the display panel 10 faces the lower surface of the cap 40. As shown in FIGS. 13 and 14, the cap 40 may include an indented portion 41 in the lower surface thereof, having a shape engaged with the upper surface CSUS of the case CS. That is, the upper surface CSUS of the case CS may have a shape engaged with the indented portion 41 of the cap 40. As described above, as shown in FIG. 13, the upper surface of the cap 40 may be approximately flat, and as shown in FIG. 14, the upper surface of the cap 40 may have a shape similar to the lower surface of the cap 40.

The lower surface of the cap 40 may be non-adhesive processed. Specifically, the entire lower surface of the cap 40 may be coated by fluorine-based compound. Accordingly, even though the lower surface of the cap 40 contacts the second adhesive layer AL2 attached to the display panel 10, the second adhesive layer AL2 may not be attached to the cap 40. In an embodiment, fluorine-based compound may include at least one of polytetrafluoroethylene ("PTFE") and polyvinylidene fluoride ("PVDF").

The display panel 10 may be transformed by being pressed by external force (e.g., bending or compressing force), and may have preset plane and curved surface. Specifically, when pressure is applied to the cap 40 in a direction of the display panel 10, the upper surface of the display panel 10 may be closely attached to the indented portion 41 of the cap 40, and the lower surface of the display panel 10 may be closely attached to the upper surface CSUS of the case CS. Accordingly, the display panel 10 may be transformed according to the shape of the indented portion 41 of the cap 40. That is, the display panel 10 may be transformed according to the shape of the upper surface CSUS of the case CS. In an embodiment, a portion of the display panel 10 may contact the indented portion 41 of the cap 40. As pressure is applied to the cap 40 in a direction of the display panel 10, pressure may be applied to the display panel 10. Because the upper surface CSUS of the case CS and the indented portion 41 of the cap 40 having preset plane and curved surface are engaged with each other, the display panel 10 disposed between the case CS and the cap 40 may be transformed according to the shape of the indented portion 41 of the cap 40. Accordingly, the remaining portions of the display panel 10 may contact the indented portion 41 of the cap 40. That is, unlike the operation of attaching the display panel 10 described above with reference to FIG. 9, in an operation of pressing the display panel 10, the first area A1, the second area A2, the intermediate area MA, and the corner area CNA of the display panel 10 may contact the upper surface CSUS of the case CS, and be attached to the upper surface CSUS of the case CS. The first adhesive layer AU attached to the lower surface of the display panel 10, and the second adhesive layer AL2 attached to the upper surface of the display panel 10 may be also transformed together with the display panel 10, and may have preset plane and curved surface.

Through this procedure, as described above with reference to FIGS. 1, 2A to 2C, the first area A1, the second area A2, the intermediate area MA, and the corner area CNA of the display panel 10 may be bent. Specifically, when the display panel 10 is pressured by external force, the first area A1 or the second area A2 of the display panel 10 may be bent around one of axes. In an embodiment, the first area A1 may be bent around an axis extending in the second direction, and the second area A2 may be bent around an axis extending in the first direction. In addition, the intermediate area MA and the corner area CNA may be bent in a preset direction. Accordingly, the display panel 10 may have preset plane and curved surface.

In the case where the corner area CNA of the display panel 10 is bent, the plurality of extension areas EA arranged in the corner area CNA of the display panel 10 may be changed in its position, and thus, the shape of the separation area SA between two extension areas EA adjacent to each other may be changed. In an embodiment, when external force is applied to the extension areas EA, the extension areas EA may be respectively bent by different curvatures, and simultaneously, the area of the separation area SA between the extension areas EA adjacent to each other may be reduced. That is, extension areas EA may be respectively bent around axes extending in different directions, and a distance between the extension areas EA may be reduced.

In the case where the corner area CNA of the display panel 10 is bent such that the display panel 10 has a three-dimensional shape by a flat guide film or the like, it may not be easy to control the extension areas EA such that the extension areas EA are bent in a preset direction. That is, a distance between the extension areas EA that are reduced may be different from a preset distance. In this case, the position of the plurality of pixels PX arranged in the extension area EA may be different from a preset position. Accordingly, the display apparatus 1 may not display high-quality images in the corner area CNA.

In contrast, the display panel 10 of the display apparatus 1 manufactured in an embodiment, may be preliminarily formed or provided by the case CS and the cap 40 each having a three-dimensional shape. Accordingly, the extension areas EA may be preliminarily formed or provided by the case CS and the cap 40 each having a three-dimensional shape. Accordingly, the extension areas EA may be bent in a preset direction. That is, a distance between the extension areas EA that are reduced may be the same as a preset distance. Because the extension area EA bent in the preset direction is attached to the case CS by the first adhesive layer AL1, the extension area EA may maintain the state bent in the preset direction even in an operation, described below with reference to FIG. 11, of coupling the display panel 10 to the cover window 20. Accordingly, because the plurality of pixels PX arranged in the extension area EA may be arranged in preset positions, the display apparatus 1 may display high-quality images even in the corner areas CNA.

Figure 11:
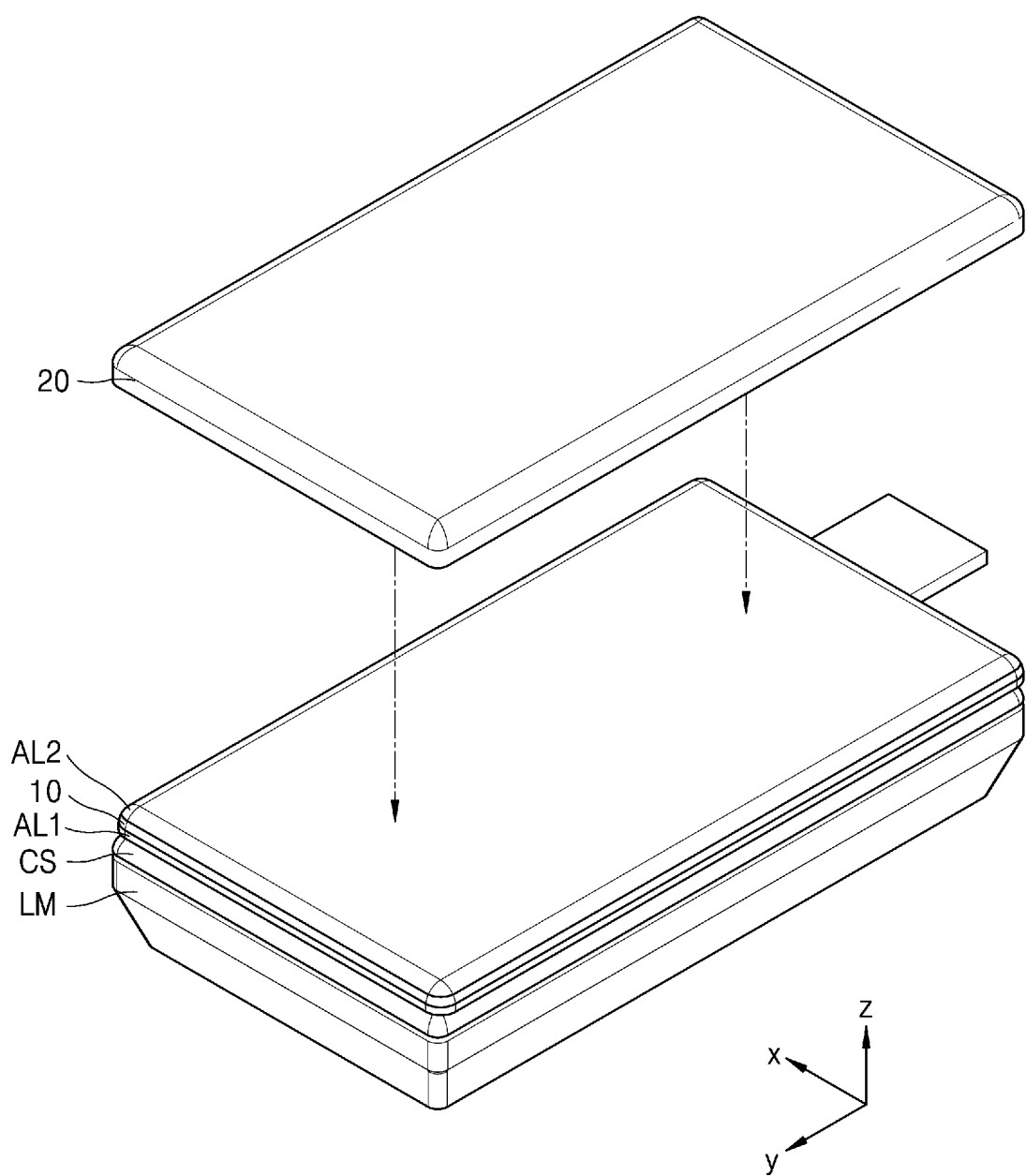

As described above, the display panel 10 may be pressed, and then, as shown in FIG. 11, the display panel 10 may be coupled to the cover window 20. Specifically, the display panel 10 is preliminarily formed or provided, and then, the cover window 20 may be disposed on the display panel 10. That is, the display panel 10 may be disposed such that the upper surface of the display panel 10 faces the cover window 20. The cap 40 disposed on the display panel 10 may be removed before the cover window 20 is disposed on the display panel 10. As described above, because the cap 40 is non-adhesive processed and is not attached to the display panel 10 by the second adhesive layer AL2, the cap 40 may be easily removed from the display panel 10. After the cap 40 is removed from the display panel 10, the display panel 10 may be coupled to the cover window 20 by the second adhesive layer AL2 disposed on the display panel 10.

To prepare the cover window 20, the cover window 20 may be transformed to have a plane and a curved surface by a jig (not shown) including an indented portion corresponding to a final shape of the cover window 20. That is, the jig may be a frame having a shape of the display apparatus 1 to be finally manufactured. The cover window 20 may be closely attached to the indented portion of the jig, and the cover window 20 may be transformed according to the shape of the indented portion of the jig. Though not shown in FIG. 11, the cover window 20 together with the jig may be coupled to the display panel 10, and then, the jig may be removed from the cover window 20.

The cover window 20 may be attached to the entire upper surface of the display panel 10. Specifically, a portion of the display panel 10 is attached to the cover window 20 first, and pressure is applied to the cover window 20 in a direction of the display panel 10, or pressure is applied to the display panel 10 in a direction of the cover window 20. Accordingly, the remaining portions of the display panel 10 may be attached to the cover window 20. In an embodiment, a surface having no curvature (e.g., the central area CA) in the final shape of the display panel 10 is attached on the cover window 20 in the first place, pressure is applied to the cover window 20 in a direction of the display panel 10, or pressure is applied to the display panel 10 in a direction of the cover window 20. Accordingly, the outer regions (e.g., the corner area CNA) of the display panel 10 may be attached to the cover window 20. However, the invention is not limited thereto. In an embodiment, the corner area CNA of the display panel 10 is attached to the cover window 20, and then the central area CA of the display panel 10 may be attached to the cover window 20. In an alternative embodiment, the corner area CNA and the central area CA of the display panel 10 may be simultaneously attached to the cover window 20.

Figure 12:
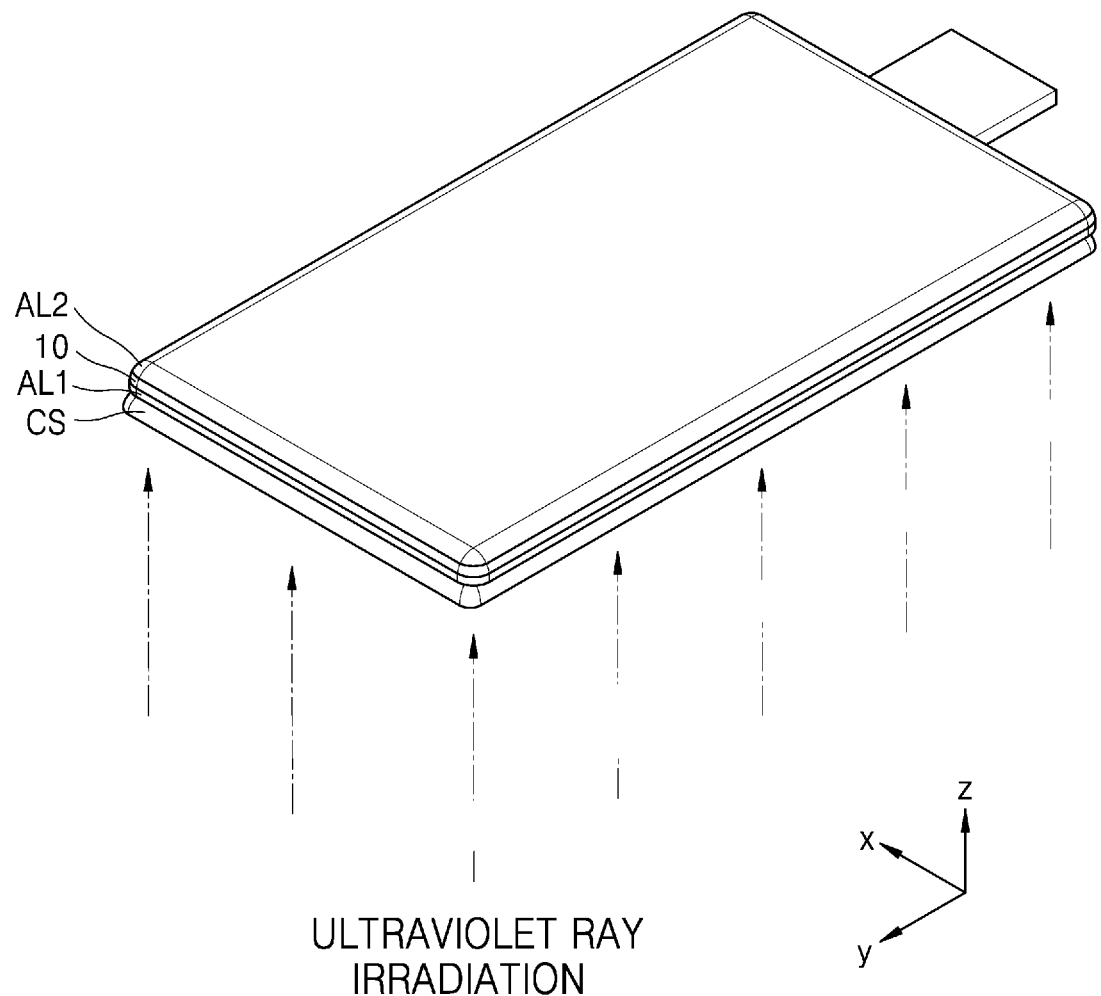

As shown in FIG. 12, the display panel 10 is attached to the cover window 20, and then the display panel 10 coupled to the cover window 20 may be detached from the case CS. Specifically, the display panel 10 may be detached from the case CS by irradiating an ultraviolet ray to the display panel 10 from a direction of the lower surface of the case CS, and reducing adhesive force of the first adhesive layer AL1. For this purpose, the case may include an ultraviolet-transmissive material.

To reduce the adhesive force of the first adhesive layer AL1 by irradiating an ultraviolet ray to the display panel 10, the lamination mold LM is separated from the case CS. Then, as shown in FIG. 12, the display panel 10 may be detached from the case CS by irradiating an ultraviolet ray in the direction of the lower surface of the case CS, and reducing the adhesive force of the first adhesive layer AL1.

Though it is shown in FIG. 12 that the display panel 10 coupled to the cover window 20 is detached from the case CS, the invention is not limited thereto.

Figure 15A:
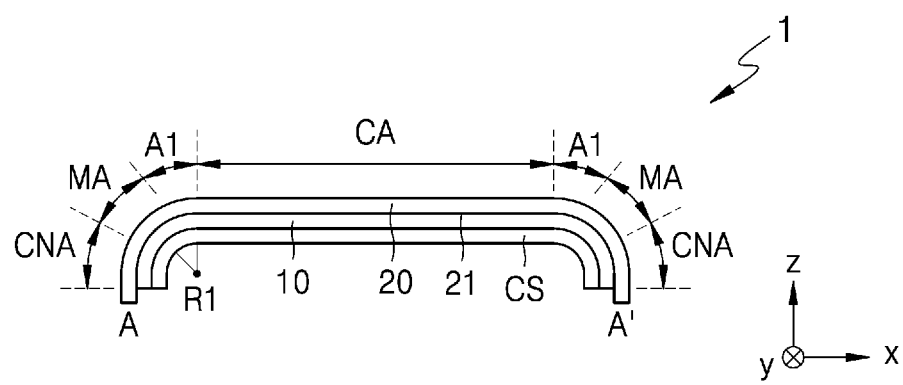
FIGS. 15A, 15B, and 15C are schematic cross-sectional views of another embodiment of a portion of a display apparatus.
Figure 15B:
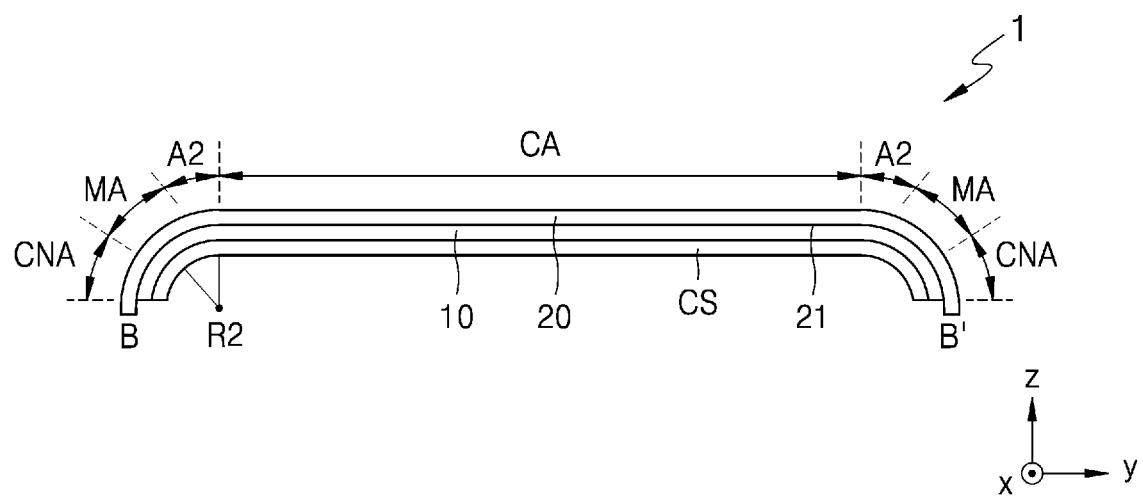
Figure 15C:
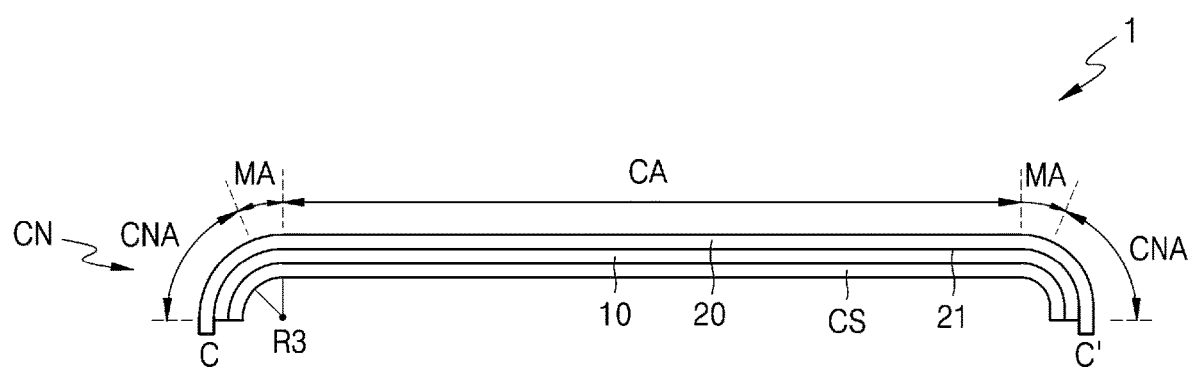

In a method of manufacturing a display apparatus in another embodiment, the display panel 10 may be attached to the cover window 20, and then, the display panel 10 coupled to the cover window 20 may not be detached from the case CS. Accordingly, the case CS may not be removed from the display panel 10 coupled to the cover window 20. That is, as shown in FIGS. 15A, 15B, and 15C, which are schematic cross-sectional views showing a portion of the display apparatus 1 in another embodiment, the display apparatus 1 may include the case CS. In this case, the case CS coupled to the display panel 10 may protect the display panel 10 from external physical impacts.

In addition, as shown in FIGS. 15A, 15B, and 15C, in the case where the case CS is not removed from the display panel 10 coupled to the cover window 20, the case CS may include a light-blocking material. The light-blocking material may include at least one of black pigment, black dye, and black particles. In an embodiment, the light-blocking material may include at least one of chrome (Cr), chrome oxide ($CrO_x$), and chrome nitride ($CrN_x$), or include a resin, graphite, non-Cr-based materials, a lactam-based pigment or a perylene-based pigment. The black pigment may include at least one of aniline black, lactam black, and perylene black.

In the display apparatus 1 in an embodiment, because the case CS is not removed from the display panel 10, external light may be prevented from being incident to the inside of the display panel 10 by the light-blocking material. Specifically, the case CS including the light-blocking material may be disposed under the display panel 10 and may overlap the central area CA, the corner area CNA, or the like of the display panel 10. Accordingly, external light incident to the inside of the display panel 10 from a direction of the lower surface (the −z direction) of the display panel 10, may be blocked by the light-blocking material.

The effects occurring when the display panel 10 is preliminarily formed or provided by the case CS and the cap 40 each having a three-dimensional shape, occur even in the case where the display panel 10 coupled to the cover window 20 is not detached from the case CS including the light-blocking material. Accordingly, for convenience of description, the duplicated descriptions made with reference to FIGS. 1 to 14 are omitted. That is, the descriptions made with reference to FIGS. 1 to 14 are applicable to the method of manufacturing the display apparatus in an embodiment with exception that the case CS includes the light-blocking material, and the display panel 10 coupled to the cover window 20 is not detached from the case CS.

In an embodiment, the method of manufacturing the display apparatus that may display high-quality images may be implemented. However, the scope of the disclosure is not limited by this effect.

It should be understood that embodiments described herein should be considered in a descriptive sense only and not for purposes of limitation. Descriptions of features or advantages within each embodiment should typically be considered as available for other similar features or advantages in other embodiments. While embodiments have been described with reference to the drawing figures, it will be understood by those of ordinary skill in the art that various changes in form and details may be made therein without departing from the spirit and scope as defined by the following claims.

What is claimed is:

1. A method of manufacturing a display apparatus, the method comprising:
   disposing a case on a lamination mold;
   disposing a display panel such that a first surface of the display panel faces a first surface of the case, and attaching the display panel on the case with a first adhesive layer between the first surface of the case and the first surface of the display panel; and
   pressing the display panel by a cap including an indented portion in a surface of the cap facing the display panel.

2. The method of claim 1, wherein the display panel includes a central area and a corner area in a corner of the display panel, and
   the attaching the display panel includes disposing the display panel such that the corner area corresponds to a corner of the case.

3. The method of claim 2, wherein the first surface of the case has a shape corresponding to the indented portion of the cap.

4. The method of claim 2, wherein the first surface of the case has a shape engaged with the indented portion of the cap.

5. The method of claim 1, wherein the case includes an elastic material.

6. The method of claim 1, wherein the case includes at least one of silicone, polycarbonate, and polyurethane.

7. The method of claim 1, wherein the attaching the display panel include disposing the cap such that a second surface of the display panel opposite to the first surface of the display panel faces the cap.

8. The method of claim 7, wherein the surface of the cap is non-adhesive processed.

9. The method of claim 7, wherein the surface of the cap is coated with fluorine-based compound.

10. The method of claim 1, wherein the attaching the display panel includes attaching a second adhesive layer to a second surface of the display panel opposite to the first surface of the display panel.

11. The method of claim 10, wherein the second adhesive layer includes at least one of a pressure sensitive adhesion, an optical clear adhesive, and an optical clear resin.

12. The method of claim 10, further comprising removing the cap from the display panel, disposing a cover window to face the second surface of the display panel, and coupling the display panel to the cover window through the second adhesive layer.

13. The method of claim 1, further comprising detaching the display panel from the case.

14. The method of claim 13, wherein the case includes an ultraviolet-transmissive material.

15. The method of claim 13, wherein the detaching of the display panel includes detaching the display panel from the case by irradiating an ultraviolet ray to the display panel in a direction of a second surface of the case opposite to the first surface of the case, and lowering adhesiveness of the first adhesive layer.

16. A method of manufacturing a display apparatus, the method comprising:
- disposing a case on a lamination mold, the case including a light-blocking layer;
- disposing a display panel such that a first surface of the display panel faces a surface of the case, and attaching the display panel on the case with a first adhesive layer between the surface of the case and the first surface of the display panel; and
- pressing the display panel by a cap including an indented portion in a surface of the cap facing the display panel.

17. The method of claim 16, wherein the display panel includes a central area and a corner area in a corner of the display panel, and
- the attaching of the display panel includes disposing the display panel such that the corner area corresponds to a corner of the case.

18. The method of claim 17, wherein the surface of the case has a shape corresponding to the indented portion of the cap.

19. The method of claim 17, wherein the surface of the case has a shape engaged with the indented portion of the cap.

20. The method of claim 16, wherein the case includes an elastic material.

21. The method of claim 16, wherein the case includes at least one of silicone, polycarbonate, and polyurethane.

22. The method of claim 16, wherein the attaching of the display panel includes disposing the cap such that a second surface of the display panel opposite to the first surface of the display panel faces the cap.

23. The method of claim 22, wherein the surface of the cap is non-adhesive processed.

24. The method of claim 22, wherein the surface of the cap is coated with a fluorine-based compound.

25. The method of claim 16, wherein the attaching of the display panel includes attaching a second adhesive layer to a second surface of the display panel opposite to the first surface of the display panel.

26. The method of claim 25, wherein the second adhesive layer includes at least one of a pressure sensitive adhesion, an optical clear adhesive, and an optical clear resin.

27. The method of claim 25, wherein removing the cap from the display panel, disposing a cover window to face the second surface of the display panel, and coupling the display panel to the cover window through the second adhesive layer.

* * * * *